United States Patent
George et al.

(10) Patent No.: US 12,272,943 B2
(45) Date of Patent: Apr. 8, 2025

(54) DEVICE, SYSTEM, AND METHOD FOR DOUBLE-CIRCUIT TRANSMISSION SYSTEMS

(71) Applicant: Hitachi Energy Ltd, Zürich (CH)

(72) Inventors: Neethu George, Karnataka (IN); Od Naidu, Karnataka (IN)

(73) Assignee: HITACHI ENERGY LTD, Zurich (CH)

( * ) Notice: Subject to any disclaimer, the term of this patent is extended or adjusted under 35 U.S.C. 154(b) by 307 days.

(21) Appl. No.: 17/701,278

(22) Filed: Mar. 22, 2022

(65) Prior Publication Data
US 2022/0337050 A1 Oct. 20, 2022

(30) Foreign Application Priority Data

Mar. 30, 2021 (IN) .............................. 202141014259
May 21, 2021 (EP) ..................................... 21175403

(51) Int. Cl.
*H02H 7/26* (2006.01)
*G01R 27/02* (2006.01)
(Continued)

(52) U.S. Cl.
CPC .............. *H02H 7/26* (2013.01); *G01R 27/02* (2013.01); *G01R 31/08* (2013.01); *G01R 31/085* (2013.01);
(Continued)

(58) Field of Classification Search
CPC ...... G01R 27/02; G01R 31/08; G01R 31/085; G01R 31/086; H02H 1/0007; H02H 1/0092; H02H 3/402; H02H 7/26; H02H 7/267
(Continued)

(56) References Cited

U.S. PATENT DOCUMENTS 5,956,220 A     9/1999  Novosel et al.
6,661,630 B1 * 12/2003  Ahn .......................... H02H 7/26
                                                                361/81
(Continued)

FOREIGN PATENT DOCUMENTS

CN          101813736 A      8/2010
CN          102435851 A      5/2012
(Continued)

OTHER PUBLICATIONS

Hu, et al., "An Adaptive Scheme for Parallel-Line Distance Protection", IEEE Transactions on Power Delivery, vol. 17, No. 1, Jan. 2002, p. 105-110.
(Continued)

*Primary Examiner* — Lisa M Caputo
*Assistant Examiner* — Joshua L Forristall
(74) *Attorney, Agent, or Firm* — Procopio, Cory, Hargreaves & Savitch LLP

(57) ABSTRACT

A device is provided that is suitable for use with a double-circuit power transmission system having a first line and a second line. The device comprises an interface to receive a current measurement for the second line. The device comprises at least one processing module operative to estimate a first zero-sequence current in the first line based on a second zero-sequence current, and determine an apparent impedance based on the estimated first zero-sequence current.

15 Claims, 13 Drawing Sheets

(51) Int. Cl.
 *G01R 31/08* (2020.01)
 *H02H 1/00* (2006.01)
(52) U.S. Cl.
 CPC ......... *G01R 31/086* (2013.01); *H02H 1/0007* (2013.01)
(58) Field of Classification Search
 USPC .......................................................... 702/58
 See application file for complete search history.

(56) References Cited

U.S. PATENT DOCUMENTS

| | | | |
|---|---|---|---|
| 11,177,645 B2* | 11/2021 | Chowdhury | G01R 31/62 |
| 2006/0097728 A1 | 5/2006 | Saha et al. | |
| 2013/0226482 A1* | 8/2013 | Sun | H02J 3/26 |
| | | | 702/60 |
| 2017/0003335 A1 | 1/2017 | Kang et al. | |
| 2023/0223751 A1* | 7/2023 | Holcombe | H02M 7/5387 |
| | | | 307/18 |

FOREIGN PATENT DOCUMENTS

| | | |
|---|---|---|
| CN | 102928733 A | 2/2013 |
| JP | S5731327 A | 2/1982 |
| JP | H4140017 A | 5/1992 |
| JP | 2003-177155 A | 6/2003 |
| WO | 99/40662 A1 | 8/1999 |
| WO | 2019/229638 A1 | 12/2019 |

OTHER PUBLICATIONS

Sharifzadeh et al., "An Adaptive Distance Scheme For Double Circuit Line Protection", UPEC 2007, Control and Intelligent Processing Center of Excellence, ECE School, University of Tehran, Iran, p. 310-315.

Bhalja et al., "High-Resistance Faults on Two Terminal Parallel Transmission Line: Analysis, Simulation Studies, and an Adaptive Distance Relaying Scheme", IEEE Transactions on Power Delivery, vol. 22, No. 2, Apr. 2007, p. 801-812.

* cited by examiner

DEVICE, SYSTEM, AND METHOD FOR DOUBLE-CIRCUIT TRANSMISSION SYSTEMS

CROSS-REFERENCE TO RELATED APPLICATIONS

The present application claims priority to Indian Patent App. No. 202141014259, filed on Mar. 30, 2021, and European Patent App. No. 21175403.1, filed on May 21, 2021, which are both hereby incorporated herein by reference as if set forth in full.

FIELD OF THE INVENTION

The present disclosure relates to power transmission systems and devices and methods for protecting power transmission systems. The present disclosure relates in particular to methods and devices that are operative to consider a mutual coupling between parallel lines of a double-circuit transmission system when performing a protection function.

BACKGROUND OF THE INVENTION

Double-circuit transmission line systems are widely employed to facilitate transmission of power in narrow physical corridors. These systems can include double-circuit towers with transmission lines sharing right-of-way or single-circuit towers.

Double-circuit transmission lines are basically current carrying conductors placed close to each other, for example being arranged in parallel. Hence, magnetic flux of one line links to the other line. Magnetic flux linkage is directly proportional to the total current flowing through the lines. Positive-sequence and negative-sequence currents flowing through the lines sum to zero and hence magnetic flux linkage is zero. Therefore, positive and negative-sequence mutual impedance does not exist in transposed parallel transmission lines.

However, zero-sequence currents in all three phases of a transmission line are in phase with each other and their sum is not equal to zero. This gives rise to mutual flux linkages between two lines and is called zero-sequence mutual coupling. The zero-sequence mutual coupling effect can be effectively represented by a zero-sequence mutual impedance in the equivalent circuit.

Distance protection which operates based on a calculated apparent impedance seen from a relay, is widely employed for transmission line protection.

Apparent impedance can be calculated using voltage and current measurements at a terminal where a protection relay is placed. Traditionally, a phase-earth element of a distance relay calculates an apparent impedance, $Z_{app}$ as in equation (1) below.

$$Z_{app} = \frac{U_{ph}}{I_{ph} + K_0 \times I_0} \quad (1)$$

$U_{ph}$ is a local phase to earth voltage in a faulted phase and $I_{ph}$ is a short circuit current in the faulted phase.

$I_0$ is the zero-sequence current. $K_0$ is a compensation factor given by $$K_0 = \frac{Z_0 - Z_1}{Z_1}.$$

$Z_0$ is the zero-sequence line impedance of the line protected by the protection relay. $Z_1$ is the positive sequence line impedance of the line protected by the protection relay.

However, Equation (1) is inaccurate for double circuit/parallel lines since it does not account for the effect of zero-sequence mutual coupling. The effect of mutual coupling, if not properly compensated for, can cause a distance element to overreach or underreach depending on the direction of current in the parallel line.

Yi Hu et al., "An adaptive scheme for parallel-line distance protection," IEEE Transactions on Power Delivery, vol. 17, no. 1, pp. 105-110, January 2002, doi: 10.1109/61.974195, and WO 1999/040662 A1 disclose an adaptive scheme for parallel line protection. The scheme uses line operation status prepared based on field data, to adjust its zone limits in a way to achieve maximum coverage and mal-operation free behavior. When the status signals are not available a worst-case zone characteristic is used.

M. Sharifzadeh and M. Sanaye-Pasand, "An adaptive distance scheme for double circuit line protection," 2007 42$^{nd}$ International Universities Power Engineering Conference, Brighton, 2007, pp. 310-315 proposes an adaptive distance protection for parallel lines. The techniques disclosed in this document do not perform well for all system conditions.

B. R. Bhalja and R. P. Maheshwari, "High-Resistance Faults on Two Terminal Parallel Transmission Line: Analysis, Simulation Studies, and an Adaptive Distance Relaying Scheme," IEEE Transactions on Power Delivery, vol. 22, no. 2, pp. 801-812, April 2007 provides an analysis of the apparent impedance as seen from the relaying point taking into account the effects of transmission line parameter uncertainties, mutual effects of parallel lines for simple and more complex configuration, shunt capacitance influences and variations in the system external to the protected line. An adaptive digital distance relaying scheme is proposed using radial basis function neural network. The huge data and training requirement by neural network schemes might not be desirable for various protection applications.

Zero-sequence mutual coupling effect in double-circuit/parallel lines renders a traditional apparent impedance calculation according to Equation (1) inaccurate.

In order to improve the accuracy of the determined apparent impedance, a term proportional to a current in the healthy parallel line can be taken into consideration for a calculation of the apparent impedance in double circuit/parallel lines. Compensation for zero-sequence mutual coupling can be achieved by modifying a relay current to include a term proportional to the current flowing through the healthy parallel line. This conventionally requires the measurement of the current in the parallel line as an input.

However, the availability of current measurement from the parallel line can be a challenge in double-circuit lines due to many reasons. Firstly, when the parallel line is open and grounded (as may be the case for maintenance) the unavailability of a current transformer on the line side of the beaker can result in unavailability of the above-mentioned current measurement. Secondly, even when both the lines are in service, transfer of current measurement from one line to the protective relay of the other line is not desirable due to safety reasons.

Another approach to attain mutual coupling compensation can use setting groups which modifies the $K_0$ factor using domain expertise and studies. However, such approaches may be challenging to accommodate different types of systems, especially with the evolving grid with increased penetration of renewables.

SUMMARY

There is a need for improved techniques of considering mutual coupling between lines of double-circuit transmission system (such as parallel conductors of double-circuit transmission systems). There is in particular a need for a device, system, and method that allow a zero-sequence mutual coupling compensation in double-circuit transmission systems to be attained without the need of current measurement from the healthy line. There is in particular a need for a device, system, and method that allow a zero-sequence mutual coupling compensation in a double-circuit transmission system to be performed that lends itself for being used with protection functions, such as distance protection functions, for various system configurations (such as different transformer configurations).

Embodiments provide a device, system, and method operative to perform zero-sequence mutual coupling compensation in a double-circuit transmission system, which can estimate a current in a line (also referred to as "first line" herein) that extends parallel to a line protected by the device (also referred to as "second line" herein). The estimated current in the first line may be used to compute a more accurate value of an apparent impedance as seen by the device (e.g., a protection relay) and to take an appropriate protective action (such as distance protection).

The estimated current in the first line may be an estimated zero-sequence current in the first line that extends parallel to the line that is being protected. The estimated zero-sequence current may be estimated using a measured current in the line that is being protected, obviating the need to obtain a current measurement for the first line for determining the apparent impedance. The device and method eliminate the need for current measurement or transfer of current measurements from the first line (i.e., the healthy line) to the device that protects the second line (i.e., the faulted line). The apparent impedance may be determined such that it accommodates mutual coupling, thereby performing a mutual coupling compensation.

Additional information may be used for estimating the zero-sequence current in the first line. For illustration, a voltage measurement obtained at a local terminal (i.e., the terminal closer to the position of the device)

The device, system, and method afford an adaptive mutual coupling compensation for distance protection of double-circuit lines without the need of a current measurement from the healthy first line. The current in the parallel, first line is estimated using available local measurements obtained at the line being protected by the device.

The device, system, and method may be operative to perform an iterative technique in which initial estimates for a fault location, a zero-sequence current in the first line, and an apparent impedance are calculated and, subsequently, refined estimated for the fault location, zero-sequence current in the first line, and apparent impedance are calculated. The initial estimates and refined estimates may be computed using only (a) system parameters (such as (i) a line impedance, (ii) a mutual coupling impedance, and at least one of (iii) transformer impedances and (iv) source impedances) and (b) measurements obtained at the second line that is being protected by the device.

The measurements obtained at the second line may be measurements obtained at a local terminal close to the device. For illustration, for a protection relay, the initial estimates and refined estimates may be computed using only (a) system parameters (such as (i) a line impedance, (ii) a mutual coupling impedance, and at least one of (iii) transformer impedances and (iv) source impedances) and (b) measurements obtained at the a local terminal of the second line that is being protected by the device, without using measurements from a remote terminal of the second line.

The device, system, and method may be operative such that a mutual current (e.g., a current induced by the mutual coupling) is estimated by considering a fault location and parallel circuit current direction. Hence, the device and method provide more accurate techniques of determining an apparent impedance.

The device, system, and method may be operative such that the same procedure may be invoked for estimating the current in the line parallel to the line on which a protection device is provided irrespective of the transformer configuration and/or line status.

The device, system, and method may be operative such that digital substation data is used to determine a line configuration. The device and method may be operative to determine, based on the line configuration (and optionally based on a transformer configuration), which procedure is to be invoked to estimate the current in the line parallel to the line on which a protection device is provided.

The device, system, and method allow a zero-sequence current in a line parallel to a line protected by the device to be estimated, using status signals from digital substation data, local measurements and system impedance parameters. The system impedance parameters may comprise line impedances, and at least one of transformer and source impedances (depending on the line configuration).

A device according to an embodiment is operative for use with a double-circuit power transmission system having a first line and a second line, the first line being parallel to the second line. The device comprises an interface to receive a current measurement for the second line, and at least one processing module operative to compute a second zero-sequence current in the second line from the current measurement, estimate a first zero-sequence current in the first line based on the second zero-sequence current, and determine an apparent impedance based on the estimated first zero-sequence current.

The device may be a protection relay.

The device may be operative for performing a protection function based on the apparent impedance.

The device may be operative for performing a distance protection function based on the apparent impedance.

The device may be operative for estimating the first zero-sequence current without using a current measurement for the first line.

The device may be operative for estimating the first zero-sequence current using a voltage measurement at a local terminal (i.e., the terminal closer to the device) of the second line.

The device may be operative for estimating the first zero-sequence current without using a voltage measurement for the first line.

The device may be operative to determine an estimate for a fault location of a fault in the second line.

The device may be operative to estimate the first zero-sequence current based on the estimate for the fault location.

The device may be operative to determine estimates for the fault location, the first zero-sequence current, and the apparent impedance in an iterative procedure.

The interface may be operative to receive a voltage measurement indicative of a zero-sequence voltage at a terminal of the second line.

The device may be operative to determine the first zero-sequence current based on the zero-sequence voltage.

The device may be operative to multiply the second zero-sequence current by a multiplicative factor to estimate the first zero-sequence current.

The device may be operative to determine the multiplicative factor.

The multiplicative factor may be independent of a status of the first line and/or of a transformer configuration of transformers at opposite terminals of both the first line and the second line.

The device may be operative such that the multiplicative factor is dependent on a status of the first line.

The device may be operative such that the multiplicative factor is dependent on whether the first line is (i) in service or (ii) open and grounded.

The device may be operative such that the multiplicative factor is dependent on a configuration of transformers at both terminals of the first line and the second line.

The device may be operative such that the multiplicative factor is dependent on whether the configuration of the transformers is (i) delta-wye grounded or (ii) wye grounded—wye grounded.

The device may be operative such that the multiplicative factor is dependent on at least one transformer impedance of the transformers for the delta-wye grounded transformer configuration.

The device may be operative such that the multiplicative factor is dependent on at least one source impedance of sources behind the transformers for the wye grounded—wye grounded transformer configuration.

The device may be operative to use digital substation data to determine the configuration of the first line and/or the configuration of the transformers.

The device may be operative to use digital substation data to determine which one of several computational procedures is to be invoked for estimating the first zero-sequence current of the first line.

The device may be operative to use the estimated first zero-sequence current in the first line to perform a mutual coupling compensation to determine the apparent impedance.

The device may be operative to determine the apparent impedance including a mutual coupling compensation, the mutual coupling compensation being dependent on the estimated first zero-sequence current in the first line.

The device may be operative to perform the mutual coupling compensation for distance protection of the double-circuit transmission system.

The device may be operative to perform the mutual coupling compensation comprising computing a sum of a short circuit current in a faulted phase of the second line, a product of a first factor and the estimated first zero-sequence current, and a product of a second factor and the second zero-sequence current to determine the apparent impedance.

The device may be operative such that estimating the first zero-sequence current may comprise, independently of whether the first line is in service and/or independently of whether the transformers are in the wye grounded-wye grounded configuration or in the delta-wye grounded configuration, estimating the first zero-sequence current I′$_0$ to such that it fulfils $$I'_0 = \frac{V_{A0} + (Z_{0L} + Z_{S2})I_0 - (AZ_{0M})I_0}{Z_{0M} - (AZ_0)}$$

where $A = \frac{(1-d)Z_{0L} + Z_{S2}}{(1-d)Z_{0M}}$ where:
$V_{A0}$ is the zero-sequence voltage at a local terminal (i.e., the terminal of the second line closer to the device);
$I_0$ is the second zero-sequence current in the second line;
d is an estimated fractional fault location from a local terminal;
$Z_{0L}$ is a positive sequence impedance of the second line;
$Z_{0M}$ is a zero-sequence mutual impedance of the first and second line;
$Z_{S2}$ is a source impedance behind the remote terminal.

The device may be operative such that estimating the first zero-sequence current may comprise, independently of whether the first line is in service and/or independently of whether the transformers are in the wye grounded-wye grounded configuration or in the delta-wye grounded configuration, estimating the first zero-sequence current I′$_0$ such that it fulfils $$I'_0 = \frac{(Z_{S1} + Z_{0L} + Z_{S2}) - (AZ_{0M})}{Z_{0M} - (AZ_0)} I_0$$

where $A = \frac{(1-d)Z_{0L} + Z_{S2}}{(1-d)Z_{0M}}$ where:
$I_0$ is the second zero-sequence current in the second line;
d is an estimated fractional fault location from a local terminal;
$Z_{0L}$ is a positive sequence impedance of the second line;
$Z_{0M}$ is a zero-sequence mutual impedance of the first and second line;
$Z_{S1}$, $Z_{S2}$ are source impedances behind the local and remote terminals, respectively.

The device may be operative such that estimating the first zero-sequence current may comprise, when the first line is in service and the transformers are in the delta-wye grounded configuration, estimating the first zero-sequence current I′$_0$ to such that it fulfils $$I'_0 = \frac{V_{A0} + (Z_{0L} + Z_{T2})I_0 - (AZ_{0M})I_0}{Z_{0M} - (AZ_0)}$$

where $A = \frac{(1-d)Z_{0L} + Z_{T2}}{(1-d)Z_{0M}}$ where:
$V_{A0}$ is the zero-sequence voltage at a local terminal (i.e., the terminal of the second line closer to the device);
$I_0$ is the second zero-sequence current in the second line;
d is an estimated fractional fault location from a local terminal;
$Z_{0L}$ is a positive sequence impedance of the second line;
$Z_{0M}$ is a zero-sequence mutual impedance of the first and second line;
$Z_{T2}$ is a transformer impedance of a remote transformer.

The device may be operative such that estimating the first zero-sequence current may comprise, when the first line is in service and the transformers are in the wye grounded—wye grounded configuration, estimating the first zero-sequence current I′$_0$ such that it fulfils $$I'_0 = \frac{V_{A0} + (Z_{0L} + Z_{S2})I_0 - (AZ_{0M})I_0}{Z_{0M} - (AZ_0)}$$

where $A = \frac{(1-d)Z_{0L} + Z_{S2}}{(1-d)Z_{0M}}$ where:

$V_{A0}$ is the zero-sequence voltage at a local terminal (i.e., the terminal of the second line closer to the device);
$I_0$ is the second zero-sequence current in the second line;
d is an estimated fractional fault location from a local terminal;
$Z_{0L}$ is a positive sequence impedance of the second line;
$Z_{0M}$ is a zero-sequence mutual impedance of the first and second line;
$Z_{S2}$ is a source impedance behind the remote terminal.

The device may be operative such that estimating the first zero-sequence current may comprise, when the first line is open and grounded and the transformers are in the delta-wye grounded configuration, estimating the first zero-sequence current $I'_0$ to such that it fulfils $$I'_0 = \frac{V_{A0} + (Z_{0L} + Z_{T2})I_0 - A(Z_{0L} - Z_{0M})I_0}{A(Z_{T2} - Z_{0L}) - Z_{T2} + Z_{0M}}$$

where $A = \frac{(1-d)Z_{0L} + Z_{T2}}{(1-d)Z_{0M} - Z_{T2}}$ where:

$V_{A0}$ is the zero-sequence voltage at a local terminal (i.e., the terminal of the second line closer to the device);
$I_0$ is the second zero-sequence current in the second line;
d is an estimated fractional fault location from a local terminal;
$Z_{0L}$ is a positive sequence impedance of the second line;
$Z_{0M}$ is a zero-sequence mutual impedance of the first and second line;
$Z_{T2}$ is a transformer impedance of a remote transformer.

The device may be operative such that estimating the first zero-sequence current may comprise, when the first line is open and grounded and the transformers are in the wye grounded-wye grounded configuration, estimating the first zero-sequence current $I'_0$ to such that it fulfils $$I'_0 = \frac{V_{A0} + (Z_{0L} + Z_{S2})I_0 - A(Z_{0L} - Z_{0M})I_0}{A(Z_{S2} - Z_{0L}) - Z_{S2} + Z_{0M}}$$

where $A = \frac{(1-d)Z_{0L} + Z_{S2}}{(1-d)Z_{0M} - Z_{S2}}$ where:

$V_{A0}$ is the zero-sequence voltage at a local terminal (i.e., the terminal of the second line closer to the device);
$I_0$ is the second zero-sequence current in the second line;
d is an estimated fractional fault location from a local terminal;
$Z_{0L}$ is a positive sequence impedance of the second line;
$Z_{0M}$ is a zero-sequence mutual impedance of the first and second line;
$Z_{S2}$ is a source impedance behind the remote terminal.

The device may be operative such that estimating the first zero-sequence current may comprise, when the first line is in service and the transformers are in the delta-wye grounded configuration, estimating the first zero-sequence current $I'_0$ such that it fulfils $$I'_0 = \frac{(Z_{T1} + Z_{0L} + Z_{T2}) - (AZ_{0M})}{Z_{0M} - (AZ_0)}I_0$$

where $A = \frac{(1-d)Z_{0L} + Z_{T2}}{(1-d)Z_{0M}}$ where:

$I_0$ is the second zero-sequence current in the second line;
d is an estimated fractional fault location from a local terminal;
$Z_{0L}$ is a positive sequence impedance of the second line;
$Z_{0M}$ is a zero-sequence mutual impedance of the first and second line;
$Z_{T1}$, $Z_{T2}$ are transformer impedances of local and remote transformers, respectively.

The device may be operative such that estimating the first zero-sequence current may comprise, when the first line is in service and the transformers are in the wye grounded-wye grounded configuration, estimating the first zero-sequence current $I'_0$ such that it fulfils $$I'_0 = \frac{(Z_{S1} + Z_{0L} + Z_{S2}) - (AZ_{0M})}{Z_{0M} - (AZ_0)}I_0$$

where $A = \frac{(1-d)Z_{0L} + Z_{S2}}{(1-d)Z_{0M}}$ where:

$I_0$ is the second zero-sequence current in the second line;
d is an estimated fractional fault location from a local terminal;
$Z_{0L}$ is a positive sequence impedance of the second line;
$Z_{0M}$ is a zero-sequence mutual impedance of the first and second line;
$Z_{S1}$, $Z_{S2}$ are source impedances behind the local and remote terminals, respectively.

The device may be operative such that estimating the first zero-sequence current may comprise, when the first line is open and grounded and the transformers are in the delta-wye grounded configuration, estimating the first zero-sequence current $I'_0$ such that it fulfils $$I'_0 = \frac{(Z_{T1} + Z_{0L} + Z_{T2}) - A(Z_{0L} - Z_{0M})}{A(Z_{T1} + Z_{T2} - Z_{0L}) - Z_{T1} - Z_{T2} + Z_{0M}}I_0$$

where $A = \frac{(1-d)Z_{0L} + Z_{T2}}{(1-d)Z_{0M} - Z_{T2}}$ where:

$I_0$ is the second zero-sequence current in the second line;
d is an estimated fractional fault location from a local terminal;
$Z_{0L}$ is a positive sequence impedance of the second line;
$Z_{0M}$ is a zero-sequence mutual impedance of the first and second line;
$Z_{T1}$, $Z_{T2}$ are transformer impedances of local and remote transformers, respectively.

The device may be operative such that estimating the first zero-sequence current may comprise, when the first line is open and grounded and the transformers are in the wye grounded-wye grounded configuration, estimating the first zero-sequence current $I'_0$ such that it fulfils $$I_0' = \frac{(Z_{S1} + Z_{0L} + Z_{S2}) - A(Z_{0L} - Z_{0M})}{A(Z_{S1} + Z_{S2} - Z_{0L}) - Z_{S1} - Z_{S2} + Z_{0M}} I_0$$

$$\text{where } A = \frac{(1-d)Z_{0L} + Z_{S2}}{(1-d)Z_{0M} - Z_{S2}}$$

where:

$I_0$ is the second zero-sequence current in the second line;
d is an estimated fractional fault location from a local terminal;
$Z_{0L}$ is a positive sequence impedance of the second line;
$Z_{0M}$ is a zero-sequence mutual impedance of the first and second lines;
$Z_{S1}$, $Z_{S2}$ are source impedances behind the local and remote terminals respectively.

The device may be operative such that the multiplicative factor may be dependent on an estimated fault location of a fault in the second line.

The device may be operative for determining the estimated fault location based on a phase to earth voltage in the second line, $U_{ph}$, a short circuit current in the second line, $I_{ph}$, a zero-sequence line impedance of the second line, $Z_{0L}$, a positive sequence line impedance of the second line, $Z_1$, and the second zero-sequence current, $I_0$.

The device may be operative to determine the estimated fault location, the first zero-sequence current, and the apparent impedance in an iterative procedure.

The device may be operative such that, in a first iteration of the iterative procedure, an initial fractional fault location estimate may be determined such that it fulfils $$d_{in} = \frac{U_{ph}}{Z_1 I_{ph} + (Z_{0L} - Z_1)I_0}$$

The device may be operative such that, in the first iteration of the iterative procedure, an initial estimate for the apparent impedance may be determined such that it fulfils $$Z_{app,in} = \frac{U_{ph}}{I_{ph} + K_0 I_0 + K_{0m} I_0'(d_{in})}$$

$$\text{where } K_0 = \frac{Z_{0L} - Z_1}{Z_1}, K_{0m} = \frac{Z_{0L}}{Z_{0M}},$$

where:

$I_0'(d_{in})$ is an initial estimate for the first zero-sequence current obtained for the initial fractional fault location estimate $d_{in}$,
$U_{ph}$ is a phase to earth voltage in a phase associated with the second line,
$I_{ph}$ is a short circuit current in the phase associated with the second line,
$Z_{0L}$ is a zero-sequence line impedance of the second line,
$Z_1$ is a positive sequence line impedance of the second line, and
$Z_{0M}$ is a zero-sequence mutual impedance of the first and second lines in an unfaulted state.

The device may be operative such that, in a second iteration of the iterative procedure, the fault location may be determined as a refined fractional fault location estimate $$d = \frac{Z_{app,in}}{Z_1}$$

The device may be operative such that, in the second iteration of the iterative procedure, a refined estimate for the apparent impedance is determined such that it fulfils $$Z_{app} = \frac{U_{ph}}{I_{ph} + K_0 I_0 + K_{0m} I_0'(d)}$$

$$\text{where } K_0 = \frac{Z_{0L} - Z_1}{Z_1}, K_{0m} = \frac{Z_{0M}}{Z_{0L}},$$

where:

$I_0'(d)$ is a refined estimate for the first zero-sequence current obtained for the refined fractional fault location estimate.

The device may be operative such that the refined estimate for the apparent impedance after a $k^{th}$ iteration of the iterative procedure, where k≥2, is used for performing a protection function, in particular a distance protection function.

The device may be operative to receive a current measurement in the second line from a current transformer and process the current measurement to estimate the first zero-sequence impedance.

An electric power system according to an embodiment comprises a double-circuit transmission system comprising a first line; a second line parallel to the first line; and the device of any embodiment disclosed herein operatively coupled to the second line to perform a protection function for the second line.

The first line and the second line may form a three-phase double-circuit transmission system.

The first line and the second line may have equal line impedances.

The first line and the second line may have the same length and the same diameter.

First terminals of the first line and the second line may be coupled to a first bus and second ends of the first line and the second line may be coupled to a second bus.

The electric power system may be a power generation, distribution or transmission system, having a first source coupled to the first and second lines via a first transformer and having a second source coupled to the first and second lines via a second transformer.

The device may be a protection relay.

The electric power system may comprise a current transformer to perform the current measurement in the second line.

The electric power system may comprise a voltage sensing device to sense a voltage at the local terminal and provide the sensed voltage to the device for use in estimating the first zero-sequence current.

The electric power system may comprise a relay, circuit breaker, or switch that trips responsive to the apparent impedance.

A method according to an embodiment comprises estimating, by a device, a first zero-sequence current in a first line of a double-circuit transmission system, the first line being parallel to a faulted second line, the first zero-sequence current being estimated based on a second zero-sequence current in the second line, and determining, by the device, an apparent impedance based on the estimated first zero-sequence current.

The method may further comprise computing the second zero-sequence current in the second line from a current measurement.

The method may further comprise performing a protection function based on the apparent impedance.

The protection function may be a distance protection function.

The first zero-sequence current may be estimated without using a current measurement for the first line.

The first zero-sequence current may be estimated using a voltage measurement at a local terminal (i.e., the terminal closer to the device) of the second line.

The first zero-sequence current may be estimated without using a voltage measurement for the first line.

The method may comprise determining an estimate for a fault location of a fault in the second line.

The first zero-sequence current may be estimated based on the estimate for the fault location.

The method may comprise an iterative process to determine estimates for the fault location, the first zero-sequence current, and the apparent impedance.

The method may comprise receiving a voltage measurement indicative of a zero-sequence voltage at a terminal of the second line.

The first zero-sequence current may be determined based on the zero-sequence voltage.

Estimating the first zero-sequence current may comprise multiplying the second zero-sequence current by a multiplicative factor.

The multiplicative factor may be independent of a status of the first line and/or of a transformer configuration of transformers at opposite terminals of both the first line and the second line.

The multiplicative factor may be dependent on a status of the first line.

The multiplicative factor may be dependent on whether the first line is (i) in service or (ii) open and grounded.

The multiplicative factor may be dependent on a configuration of transformers at both terminals of the first line and the second line.

The multiplicative factor may be dependent on whether the configuration of the transformers is (i) delta-wye grounded or (ii) wye grounded—wye grounded.

The multiplicative factor may be dependent on at least one transformer impedance of the transformers for the delta-wye grounded transformer configuration.

The multiplicative factor may be dependent on at least one source impedance of sources behind the transformers for the wye grounded—wye grounded transformer configuration.

The method may further comprise using digital substation data to determine the configuration of the first line and/or the configuration of the transformers.

The method may further comprise using digital substation data to determine which one of several computational procedures is to be invoked for estimating the first zero-sequence current of the first line.

The method may comprise performing a mutual coupling compensation based on the estimated first zero-sequence current in the first line to determine the apparent impedance.

The method may comprise determining the apparent impedance including a mutual coupling compensation, the mutual coupling compensation being dependent on the estimated first zero-sequence current in the first line.

The method may comprise performing the mutual coupling compensation for distance protection of the double-circuit transmission system.

Performing the mutual coupling compensation comprising computing a sum of a short circuit current in a faulted phase of the second line, a product of a first factor and the estimated first zero-sequence current, and a product of a second factor and the second zero-sequence current to determine the apparent impedance.

Estimating the first zero-sequence current may comprise, independently of whether the first line is in service and/or independently of whether the transformers are in the wye grounded-wye grounded configuration or in the delta-wye grounded configuration, estimating the first zero-sequence current $I'_0$ such that it fulfils $$I'_0 = \frac{V_{A0} + (Z_{0L} + Z_{S2})I_0 - (AZ_{0M})I_0}{Z_{0M} - (AZ_0)}$$

where $A = \frac{(1-d)Z_{0L} + Z_{S2}}{(1-d)Z_{0M}}$ where:
$V_{A0}$ is the zero-sequence voltage at a local terminal (i.e., the terminal of the second line closer to the device);
$I_0$ is the second zero-sequence current in the second line;
d is an estimated fractional fault location from a local terminal;
$Z_{0L}$ is a positive sequence impedance of the second line;
$Z_{0M}$ is a zero-sequence mutual impedance of the first and second line;
$Z_{S2}$ is a source impedance behind the remote terminal.

Estimating the first zero-sequence current may comprise, independently of whether the first line is in service and/or independently of whether the transformers are in the wye grounded-wye grounded configuration or in the delta-wye grounded configuration, estimating the first zero-sequence current $I'_0$ such that it fulfils $$I'_0 = \frac{(Z_{S1} + Z_{0L} + Z_{S2}) - (AZ_{0M})}{Z_{0M} - (AZ_0)} I_0$$

where $A = \frac{(1-d)Z_{0L} + Z_{S2}}{(1-d)Z_{0M}}$ where:
$I_0$ is the second zero-sequence current in the second line;
d is an estimated fractional fault location from a local terminal;
$Z_{0L}$ is a positive sequence impedance of the second line;
$Z_{0M}$ is a zero-sequence mutual impedance of the first and second line;
$Z_{S1}$, $Z_{S2}$ are source impedances behind the local and remote terminals, respectively.

Estimating the first zero-sequence current may comprise, when the first line is in service and the transformers are in the delta-wye grounded configuration, estimating the first zero-sequence current $I'_0$ such that it fulfils $$I'_0 = \frac{V_{A0} + (Z_{0L} + Z_{T2})I_0 - (AZ_{0M})I_0}{Z_{0M} - (AZ_0)}$$

where $A = \frac{(1-d)Z_{0L} + Z_{T2}}{(1-d)Z_{0M}}$ where:
$V_{A0}$ is the zero-sequence voltage at a local terminal (i.e., the terminal of the second line closer to the device);
$_0$ is the second zero-sequence current in the second line;
d is an estimated fractional fault location from a local terminal;

$Z_{0L}$ is a positive sequence impedance of the second line;
$Z_{0M}$ is a zero-sequence mutual impedance of the first and second line;
$Z_{T2}$ is a transformer impedance of a remote transformer.

Estimating the first zero-sequence current may comprise, when the first line is in service and the transformers are in the wye grounded—wye grounded configuration, estimating the first zero-sequence current $I'_0$ such that it fulfils $$I'_0 = \frac{V_{A0} + (Z_{0L} + Z_{S2})I_0 - (AZ_{0M})I_0}{Z_{0M} - (AZ_0)}$$

$$\text{where } A = \frac{(1-d)Z_{0L} + Z_{S2}}{(1-d)Z_{0M}}$$

where:
$V_{A0}$ is the zero-sequence voltage at a local terminal (i.e., the terminal of the second line closer to the device);
$I_0$ is the second zero-sequence current in the second line;
d is an estimated fractional fault location from a local terminal;
$Z_{0L}$ is a positive sequence impedance of the second line;
$Z_{0M}$ is a zero-sequence mutual impedance of the first and second line;
$Z_{S2}$ is a source impedance behind the remote terminal.

Estimating the first zero-sequence current may comprise, when the first line is open and grounded and the transformers are in the delta-wye grounded configuration, estimating the first zero-sequence current $I'_0$ such that it fulfils $$I'_0 = \frac{V_{A0} + (Z_{0L} + Z_{T2})I_0 - A(Z_{0L} - Z_{0M})I_0}{A(Z_{T2} - Z_{0L}) - Z_{T2} + Z_{0M}}$$

$$\text{where } A = \frac{(1-d)Z_{0L} + Z_{T2}}{(1-d)Z_{0M} - Z_{T2}}$$

where:
$V_{A0}$ is the zero-sequence voltage at a local terminal (i.e., the terminal of the second line closer to the device);
$I_0$ is the second zero-sequence current in the second line;
d is an estimated fractional fault location from a local terminal;
$Z_{0L}$ is a positive sequence impedance of the second line;
$Z_{0M}$ is a zero-sequence mutual impedance of the first and second line;
$Z_{T2}$ is a transformer impedance of a remote transformer.

Estimating the first zero-sequence current may comprise, when the first line is open and grounded and the transformers are in the wye grounded—wye grounded configuration, estimating the first zero-sequence current $I'_0$ such that it fulfils $$I'_0 = \frac{V_{A0} + (Z_{0L} + Z_{S2})I_0 - A(Z_{0L} - Z_{0M})I_0}{A(Z_{S2} - Z_{0L}) - Z_{S2} + Z_{0M}}$$

$$\text{where } A = \frac{(1-d)Z_{0L} + Z_{S2}}{(1-d)Z_{0M} - Z_{S2}}$$

where:
$V_{A0}$ is the zero-sequence voltage at a local terminal (i.e., the terminal of the second line closer to the device);
$I_0$ is the second zero-sequence current in the second line;
d is an estimated fractional fault location from a local terminal;
$Z_{0L}$ is a positive sequence impedance of the second line;
$Z_{0M}$ is a zero-sequence mutual impedance of the first and second line;
$Z_{S2}$ is a source impedance behind the remote terminal.

Estimating the first zero-sequence current may comprise, when the first line is in service and the transformers are in the delta-wye grounded configuration, the first zero-sequence current $I'_0$ is estimated such that it fulfils $$I'_0 = \frac{(Z_{T1} + Z_{0L} + Z_{T2}) - (AZ_{0M})}{Z_{0M} - (AZ_0)}I_0$$

$$\text{where } A = \frac{(1-d)Z_{0L} + Z_{T2}}{(1-d)Z_{0M}}$$

where:
$I_0$ is the second zero-sequence current in the second line;
d is an estimated fractional fault location from a local terminal;
$Z_{0L}$ is a positive sequence impedance of the second line;
$Z_{0M}$ is a zero-sequence mutual impedance of the first and second line;
$Z_{T1}$, $Z_{T2}$ are transformer impedances of local and remote transformers, respectively.

Estimating the first zero-sequence current may comprise, when the first line is in service and the transformers are in the wye grounded-wye grounded configuration, the first zero-sequence current $I'_0$ is estimated such that it fulfils $$I'_0 = \frac{(Z_{S1} + Z_{0L} + Z_{S2}) - (AZ_{0M})}{Z_{0M} - (AZ_0)}I_0$$

$$\text{where } A = \frac{(1-d)Z_{0L} + Z_{S2}}{(1-d)Z_{0M}}$$

where:
$I_0$ is the second zero-sequence current in the second line;
d is an estimated fractional fault location from a local terminal;
$Z_{0L}$ is a positive sequence impedance of the second line;
$Z_{0M}$ is a zero-sequence mutual impedance of the first and second line;
$Z_{S1}$, $Z_{S2}$ are source impedances behind the local and remote terminals, respectively.

Estimating the first zero-sequence current may comprise, when the first line is open and grounded and the transformers are in the delta-wye grounded configuration, the first zero-sequence current $I'_0$ is estimated such that it fulfils $$I'_0 = \frac{(Z_{T1} + Z_{0L} + Z_{T2}) - A(Z_{0L} - Z_{0M})}{A(Z_{T1} + Z_{T2} - Z_{0L}) - Z_{T1} - Z_{T2} + Z_{0M}}I_0$$

$$\text{where } A = \frac{(1-d)Z_{0L} + Z_{T2}}{(1-d)Z_{0M} - Z_{T2}}$$

where:
$I_0$ is the second zero-sequence current in the second line;
d is an estimated fractional fault location from a local terminal;
$Z_{0L}$ is a positive sequence impedance of the second line;
$Z_{0M}$ is a zero-sequence mutual impedance of the first and second line;
$Z_{T1}$, $Z_{T2}$ are transformer impedances of local and remote transformers, respectively.

Estimating the first zero-sequence current may comprise, when the first line is open and grounded and the transformers are in the wye grounded-wye grounded configuration, the first zero-sequence current I'$_0$ is estimated such that it fulfils $$I'_0 = \frac{(Z_{S1} + Z_{0L} + Z_{S2}) - A(Z_{0L} - Z_{0M})}{A(Z_{S1} + Z_{S2} - Z_{0L}) - Z_{S1} - Z_{S2} + Z_{0M}} I_0$$

$$\text{where } A = \frac{(1-d)Z_{0L} + Z_{S2}}{(1-d)Z_{0L} - Z_{S2}}$$

where:
I$_0$ is the second zero-sequence current in the second line;
d is an estimated fractional fault location from a local terminal;
Z$_{0L}$ is a positive sequence impedance of the second line;
Z$_{0M}$ is a zero-sequence mutual impedance of the first and second lines;
Z$_{S1}$, Z$_{S2}$ are source impedances behind the local and remote terminals respectively.

The multiplicative factor may be dependent on an estimated fault location of a fault in the second line.

The method may further comprise determining the estimated fault location based on a phase to earth voltage in the second line, U$_{ph}$, a short circuit current in the second line, I$_{ph}$, a zero-sequence line impedance of the second line, Z$_{0L}$, a positive sequence line impedance of the second line, Z$_1$, and the second zero-sequence current, I$_0$.

The estimated fault location, the first zero-sequence current, and the apparent impedance may be determined in an iterative procedure.

In a first iteration of the iterative procedure, an initial fractional fault location estimate may be determined such that it fulfils $$d_{in} = \frac{U_{ph}}{Z_1 I_{ph} + (Z_{0L} - Z_1)I_0}$$

In the first iteration of the iterative procedure, an initial estimate for the apparent impedance may be determined such that it fulfils $$Z_{app,in} = \frac{U_{ph}}{I_{ph} + K_0 I_0 + K_{0m} I'_0(d_{in})}$$

$$\text{where } K_0 = \frac{Z_{0L} - Z_1}{Z_1}, K_{0m} = \frac{Z_{0L}}{Z_{0M}},$$

where:
I$_0$'(d$_{in}$) is an initial estimate for the first zero-sequence current obtained for the initial fractional fault location estimate d$_{in}$,
U$_{ph}$ is a phase to earth voltage in a phase associated with the second line,
I$_{ph}$ is a short circuit current in the phase associated with the second line,
Z$_0$ is a zero-sequence line impedance of the second line,
Z$_1$ is a positive sequence line impedance of the second line, and
Z$_{0M}$ is a zero-sequence mutual impedance of the first and second lines in an unfaulted state.

In a second iteration of the iterative procedure, the fault location may be determined as a refined fractional fault location estimate $$d = \frac{Z_{app,in}}{Z_1}$$

In the second iteration of the iterative procedure, a refined estimate for the apparent impedance is determined such that it fulfils $$Z_{app} = \frac{U_{ph}}{I_{ph} + K_0 I_0 + K_{0m} I'_0(d)}$$

$$\text{where } K_0 = \frac{Z_{0L} - Z_1}{Z_1}, K_{0m} = \frac{Z_{0M}}{Z_{0L}},$$

where:
I$_0$'(d) is a refined estimate for the first zero-sequence current obtained for the refined fractional fault location estimate.

The refined estimate for the apparent impedance after a k$^{th}$ iteration of the iterative procedure, where k≥2, is used for performing a protection function, in particular a distance protection function.

The method may further comprise receiving a current measurement in the second line from a current transformer and processing the current measurement to estimate the first zero-sequence impedance.

The first line and the second line may form a three-phase transmission system.

The first line and the second line may have approximately equal line impedances.

The first line and the second line may have the same length and the same diameter.

First terminals of the first line and the second line may be coupled to a first bus and second ends of the first line and the second line may be coupled to a second bus.

The first and second lines may be comprised by an electric power system, in particular a power generation, distribution or transmission system, having a first source coupled to the first and second lines via a first transformer and having a second source coupled to the first and second lines via a second transformer.

The method is performed by a protection relay.

The method may further comprise measuring, by a current transformer, the current in the second line.

The method may further comprise tripping a relay, circuit breaker, or switch as a function of the apparent impedance.

Various effects and advantages are attained by the device, system, and method according to embodiments.

Adaptive mutual coupling compensation for distance protection of double-circuit transmission system lines is attained without the need of current measurement from the first line that extends parallel to the line being protected by the device that determines an apparent impedance. A transfer of current measurement from the first line to the device (e.g., relay) on the line being protected (i.e., the second line), which may be undesirable due to unavailability of the measurement or safety concerns, is not required for the adaptive mutual coupling compensation.

The device, system, and method are operative without requiring setting groups obtained from domain expertise, standards and studies. The device, system, and method are suitable for use in a modern evolving grid with increased penetration of renewables.

The device, system, and method considers the direction change of current of parallel circuit, hence it is more accurate than conventional techniques.

The devices, methods, and systems according to embodiments can be used in association with a three-phase transmission system having parallel lines. The devices, methods, and systems may be used to improve a distance protection function performed by a protection relay, without being limited thereto.

BRIEF DESCRIPTION OF THE DRAWINGS

The subject-matter will be explained in more detail with reference to preferred exemplary embodiments which are illustrated in the attached drawings, in which.

DETAILED DESCRIPTION OF EMBODIMENTS

Figure 1:
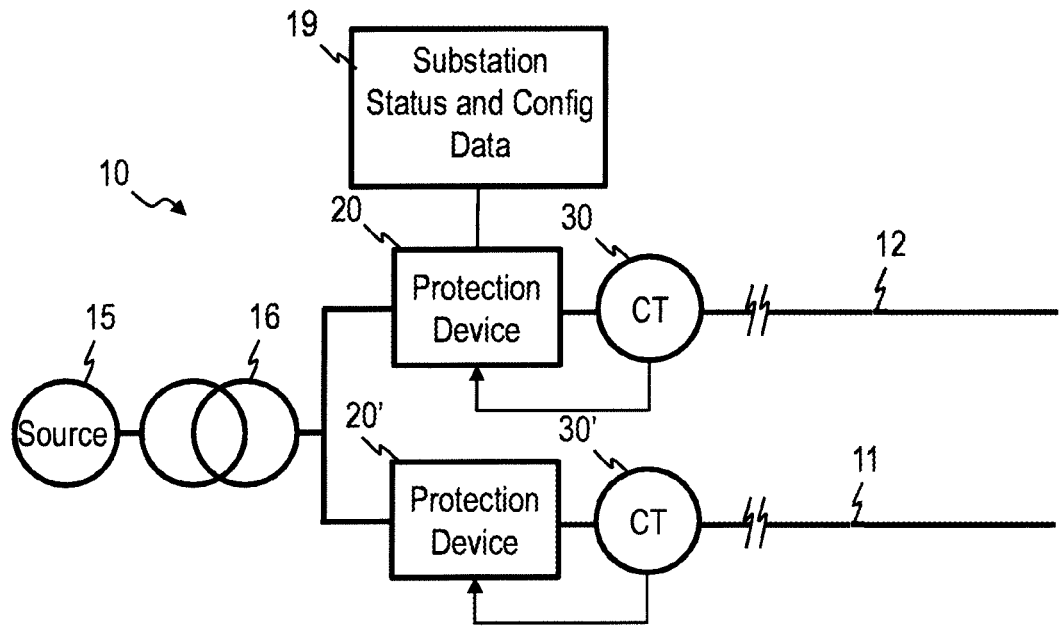
FIG. 1 is a schematic partial representation of a system comprising double-circuit lines and a protection device.

Exemplary embodiments will be described with reference to the drawings in which identical or similar reference signs designate identical or similar elements. While some embodiments will be described in the context of, the methods and devices described in detail below may be used in a wide variety of systems.

The features of embodiments may be combined with each other, unless specifically noted otherwise.

According to embodiments, devices and methods are provided that are operative to perform a protection function, in particular a distance protection function, for an electric power system. More specifically, the devices and methods may be operative to provide mutual coupling compensation for distance protection functions in a double-circuit transmission system. As used herein, the term "double-circuit transmission system" (which is frequently also referred to as "double-circuit transmission line" in the art) carries conductors for two circuits. For two-phase double-circuit transmission systems, each tower supports and insulates four conductors. For three-phase double-circuit transmission systems, each tower supports and insulates six conductors. Generally, a double-circuit transmission system is a transmission system in which conductors of two circuits share the same right-of-way and/or are suspended on the same towers.

A protection device may be implemented as a protection relay. The protection device may be operatively associated with a second line of a double-circuit transmission system, with the double-circuit transmission system having a first line extending parallel to the second line.

The protection device may be operative to receive a current measurement obtained for the second line (e.g., from a current transformer at the second line), to estimate a first zero-sequence current in the first line based on a second zero-sequence current in the second line, and to determine an apparent impedance based on the estimated first zero-sequence current.

The apparent impedance may be determined based on current and voltage measurements obtained on the second line with which the protection device is associated, and without requiring any current measurements obtained on the first line.

Determining the apparent impedance may comprise determining the apparent impedance in dependence on a weighted sum of the first zero-sequence current and of the second zero-sequence current. The weighted sum may be determined as $K_0 I_0 + K_{0m} I_0'$, where $I_0$ is the second zero-sequence current that is obtained by processing a measurement and $I'_0$ is the estimated first zero-sequence current. The coefficients $K_0$ and $K_{0m}$ may be dependent on system impedances (in particular line impedances). In this manner, mutual coupling may be taken into account (thereby providing mutual coupling compensation).

The protection device may be operative to perform a protection function for the second line based on the apparent impedance. The protection function may comprise tripping protection elements, such as circuit breakers or switches. The protection function may comprise performing a controlled disconnection and/or reconnection.

Alternatively or additionally, the protection device may be operative to cause generation of output, such as an alarm, warning, or other information, in dependence on the apparent impedance. The output may be provided to an operator via a user interface.

The protection device may use various parameters, such as one or several source impedances and/or one or several transformer impedances when estimating the first zero-sequence current and/or determining the apparent impedance and/or performing mutual coupling compensation. The techniques disclosed herein are robust against inaccuracies in the numerical values of the source and/or transformer impedances. Thus, the terms "source impedance" and "transformer impedance", as used herein, encompass estimates for the source impedance or transformer impedance or other values that accommodate some variations from the actual values.

FIG. 1 is a partial schematic view of an electric power system 10. The electric power system has a first line 11 and a second line 12 extending in parallel. The first and second line 11, 12 may each be conductors of a double-circuit transmission system.

The first and second lines 11, 12 may be transmission lines of a double-circuit transmission system that are current carrying conductors placed close to each other. The first and second lines 11, 12 may be transmission lines and that may be operated such that a sum of their currents is not equal to zero.

First terminals of the first line 11 and the second line 12 may be coupled to a first transformer 16. A first source 15 may be coupled to the first transformer 16, behind the first transformer 16 (as seen from protection devices 20, 20'), i.e., at the first end of the first and second lines 11, 12.

While not shown in FIG. 1, opposite second terminals of the first line 11 and the second line 22 may be coupled to a second transformer. A second source may be coupled to the second transformer, i.e., at a second end of the first and second lines 11, 12.

A protection device 20 is provided for protection of the second line 12. The protection device 20 may be operative to provide distance protection or another protection function for the second line 22. The protection device 22 may be a protection relay.

The protection device 20 is provided at or in proximity to the first terminal of the second line 22. The first terminal is therefore also referred to as "local terminal." In the following, the transformer provided at the end of the second line 12 at which the protection device 20 is provided will be referred to as "local transformer", and the source at the end of the second line 12 at which the protection device 20 is provided will be referred to as "local source". The transformer at the opposite end of the second line 12 will be referred to as "remote transformer" and the source at the opposite end of the second line 12 will be referred to as "remote source."

It will be appreciated that another protection device (not shown in FIG. 1) is typically provided at the opposite end of the second line 12, for which the source 15 is the "remote source" (because it is provided at the end of the second line 12 opposite to the end at which this other protection device is provided) and the transformer 16 is the "remote transformer" ((because it is provided at the end of the second line 12 opposite to the end at which this other protection device is provided).

The protection device 20 is coupled to a current transformer 30 at the first end of the second line 12. The protection device 20 is operative to receive a current measurement for the second line 12. The current measurement allows a zero-sequence current of the second line 12 to be derived. The zero-sequence current for the second line 12 is referred to as "second zero-sequence current" for brevity. A zero-sequence current for the first line 11 is referred to as "first zero-sequence current" for brevity.

The protection device 20 is operative to provide an enhanced technique of taking into account mutual flux linkages between two lines 11, 12 and is called zero-sequence mutual coupling. The zero-sequence mutual coupling effect can be effectively represented by a zero-sequence mutual impedance in the equivalent circuit. The protection device 20 is operative to determine an apparent impedance, as seen from the protection device 20, that takes into account a mutual coupling and includes a term proportional to an estimate for the first zero-sequence current in the first line 11. The protection device 20 is operative to determine the apparent impedance in double circuit/parallel lines as $$Z_{app} = \frac{U_{ph}}{I_{ph} + K_0 I_0 + K_{0m} I'_0} \quad (2)$$

where $I'_0$ is an estimate for the first zero-sequence current in the parallel first line 11, $K_{0m}$ and $K_0$ are coefficients that depend on line impedance, as will be explained in more detail below, with $K_{0m}$ being proportional to a mutual impedance between the first and second lines 11, 12.

The protection device 20 is operative to determine the estimate for the first zero-sequence current $I'_0$ from the measured current in the second line 12 and using system impedances (line impedances and at least one of transformer or source impedances) that are known. The procedure according to which the estimate for the first zero-sequence current $I'_0$ is determined is dependent on a transformer configuration of the transformers at both the local and remote ends of the second line 12 and on a status of the first line 11. Information on the transformer configuration and the status of the first line 11 may be retrieved by the protection device 20 from digital substation status and configuration data 19. For illustration, the digital substation status and configuration data 19 may include a substation configuration description and/or a dynamic substation topology that is used by the protection device 20 to determine which one of several procedures is to be invoked to estimate the apparent impedance.

While the operation of the device according to embodiments will be described with reference to the protection device 20, the protection device 20' associated with the first line 11 may have a similar operation. In particular, the protection device 20' may be operative to receive a current measurement for the first line 11 from a current transformer 30' on the first line 11, may estimate the second zero-sequence current based thereon and based on system impedances, using substation status and configuration data, and may determine the apparent impedance using the first zero-sequence current that is available from a measurement for the first line and the second zero-sequence current that is obtained by an estimate, without requiring any current measurement to be communicated between the protection devices 20, 20' or from the current transformer 30 to the protection device 20'.

Figure 2:
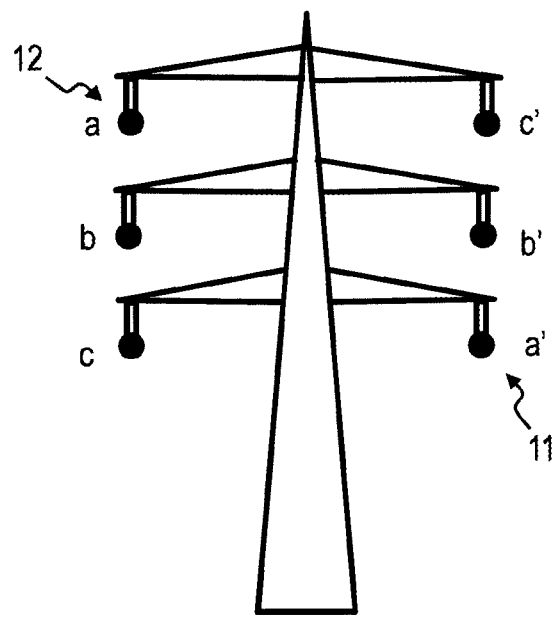
FIG. 2 is a schematic view of a double-circuit transmission system.

FIG. 2 is a schematic diagram showing a tower of a double-circuit transmission system in which conductors of two circuits share the same right-of-way and/or are supported on the same towers. The first line 11 and second line 12 may be conductors of different circuits of the double-circuit transmission system. As shown in FIG. 2, a three-phase double-circuit transmission line has a total of six conductors a', b', c', a, b, c that are provided to make two different transmission circuits, the first line 11 and the second line 12. The first line 11 includes three conductors a', b', c' corresponding to three phases, and the second line 12 includes the other three conductors a, b, c corresponding to three phases. Running the first line 11 and the second line 12 in close proximity to each other will involve inductive coupling between the conductors, for example if they are arranged in parallel.

Figure 3:
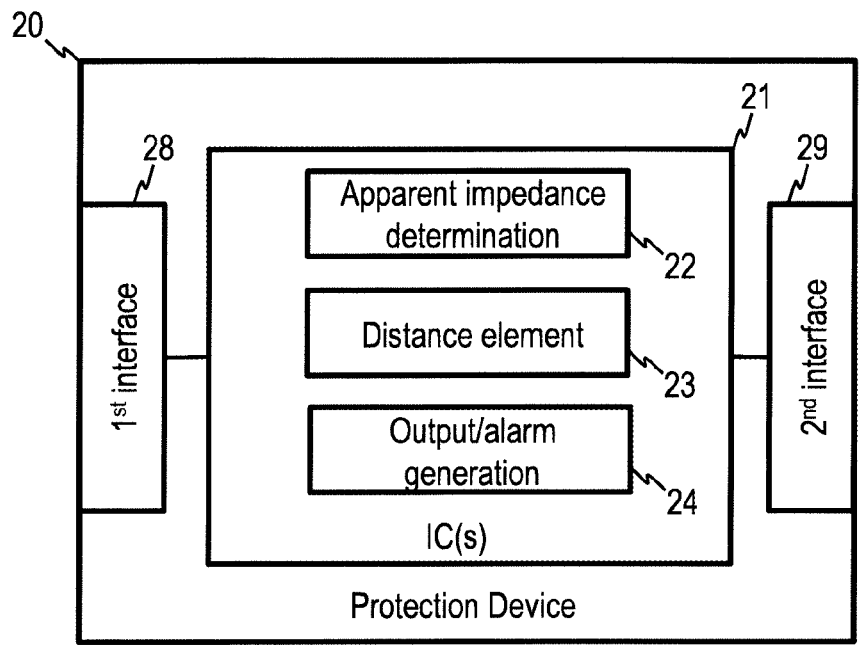
FIG. 3 is a block diagram of a protection device.

FIG. 3 is a block diagram of a protection device 20 according to an embodiment. The protection device 20 has a first interface 28 operative to receive a current measurement for the line that is being protected by the protection device 20. The first interface 20 may be operative for coupling to a current transformer.

The protection device 20 has one or several integrated circuits (IC(s)) 21 that perform processing functions. The one or several IC(s) 21 may include one or several of a processor, a microprocessor, a controller, a microcontroller, a field-programmable gate array (FPGA), an application specific integrated circuit (ASIC) or any combination thereof.

The IC(s) 21 are operative to implement an apparent impedance determination element 22. The apparent impedance determination element 22 may receive current and voltage measurements for the line that is being protected as inputs, may estimate a zero-sequence current in another line that is parallel to the line being protected, and may use the estimated zero-sequence current in the first line 11 parallel to the line on which the protection device 20 is provided, in combination with the zero-sequence current in the line that is being protected to estimate an apparent impedance, which takes into account a mutual coupling in a double-line circuit.

The IC(s) 21 may be operative to implement a distance element 23. The distance element 23 may be operative to perform a protection function, in particular a distance protection function. The distance element 23 may be operative to use the apparent impedance for determining which corrective action is required. The distance element 23 may be operative to determine an area for which protection is required. By using the apparent impedance that takes into account mutual coupling, the risk of overreaching or underreaching actions by the distance element 23 is mitigated.

The IC(s) 21 may be operative to issue signals or commands via at least one second interface 29 to cause a determined protection action to be taken.

The IC(s) 21 may be operative to implement an output generation element 24. The output generation element 24 may cause output (alarms, warning, notifications, or other information) to be output to an operator, e.g., at a control center.

Figure 4:
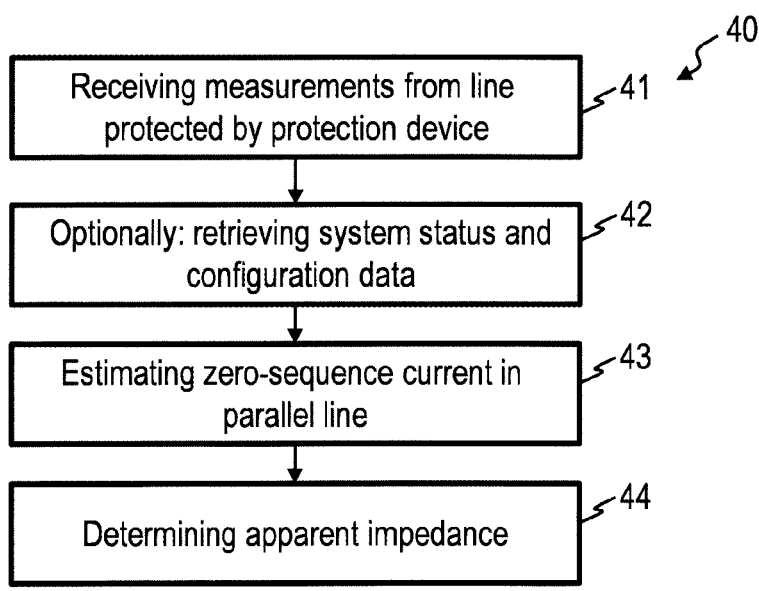
FIG. 4 is a flow chart of a method.

FIG. 4 is a flow chart of a method 40. The method 40 may be performed automatically by the protection device 20.

At step 41, a current measurement is obtained for the line that is being protected by the protection device. A voltage measurement (in particular a phase to earth voltage) may be received for the line that is being protected.

Step 41 may optionally comprise receiving a voltage measurement indicative of a zero-sequence voltage at the local terminal of the second line.

At step 42, system status and configuration data is optionally retrieved. The system status and configuration data may include information on whether another line that is parallel to the line being protected is in operation or is open and grounded (as may be the case for maintenance). The system status and configuration data may include information on a transformer configuration of transformers at both ends of the line that is being protected. Step 42 is optional. Methods and devices according to embodiments may be operative without requiring information on the status of the line that is parallel to the line being protected and/or without requiring information on the transformer configuration.

At step 43, a zero-sequence current in the line parallel to the line that is being protected is estimated. An estimate for the zero-sequence current in the line parallel to the line that is being protected may be determined from a zero-sequence current in the line that is being protected, using data processing that depends on the status of the first line (in service or open and grounded) and/or the transformer configuration. An estimate for the zero-sequence current in the line parallel to the line that is being protected may be determined without requiring, and in particular without using, any current measurement in the line parallel to the line that is being protected.

At step 44, an apparent impedance is determined using the estimate for the zero-sequence current in the line parallel to the line that is being protected. The apparent impedance may be determined such that it is dependent on a weighted sum of the first zero-sequence current and of the second zero-sequence current. The weighted sum may be determined as $K_0 I_0 + K_{0m} I_0'$, where $I_0$ is the zero-sequence current that is obtained from a measurement on the line that is being protected and $I'_0$ is the estimated zero-sequence current in the first line. The coefficients $K_0$ and $K_{0m}$ may be dependent on system impedances (in particular line impedances and at least one transformer or source impedance).

Steps 43 and 44 may be implemented in an iterative procedure. The iterative procedure may involve initializing an estimate for a fault location of a fault in the line that is being protected and an apparent impedance. The fault location, an estimate for the zero-sequence current in the first line, and the apparent impedance may be iteratively refined in at least one iteration after initialization.

The apparent impedance may be used to perform a protection function, in particular a distance protection function.

Figure 5:
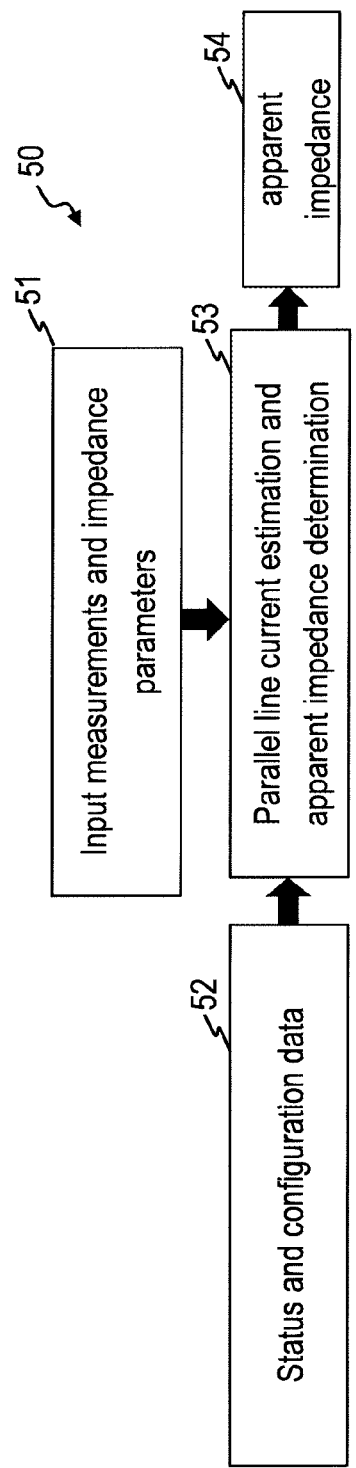
FIG. 5 is block diagram of processing performed by a protection device.

FIG. 5 is a view 50 showing the overall operation of a protection device 20 and method according to an embodiment. The inputs 51 used are voltage and current measurements from a line being protected, line impedance, and at least one of transformer impedance and source impedance parameters from both terminals. Digital substation data 52 including status of breakers at local and remote ends of both the lines are also acquired to determine the line configuration. Additionally, transformer configuration 52 information is also retrieved. Line current estimation for the first line 11 and two-step apparent impedance calculation 53 can be performed to obtain an accurate estimate for the apparent impedance (after mutual coupling compensation) 54 that may be used as output.

Techniques that may be employed in the protection device 20 and method according to an embodiment are described in two sections: (A) Estimation of zero-sequence current in the first line, and (B) Mutual coupling compensation using the estimated first zero-sequence current for the first line 11.

(A) Estimation of Zero-Sequence Current in the Parallel Line

Estimation Independently of Parallel Line Status and Transformer Configuration

Estimation of zero-sequence current in the first line 11 (i.e., the line parallel to the second line 12 being protected) can be implemented without requiring information on whether the first line 11 is in operation or open and grounded, and without requiring information on the transformer configurations at the local and remote terminals.

The device 20 may be operative to estimate the first zero-sequence current in the first line 11 as a function of at least the second zero-sequence current in the second line, an estimated fractional fault location from a local terminal, a positive sequence impedance of the second line, a zero-sequence mutual impedance of the first and second line, and a source impedance behind the remote terminal. The device 20 may additionally use at least one of (i) the zero-sequence voltage at a local terminal, (ii) a source impedance behind the local terminal for determining the estimate for the first zero-sequence current in the first line 11.

The device 20 may be operative such that estimating the first zero-sequence current may comprise, independently of whether the first line is in service and/or independently of whether the transformers are in the wye grounded-wye grounded configuration or in the delta-wye grounded configuration, estimating the first zero-sequence current I'$_0$ such that it fulfils $$I'_0 = \frac{V_{A0} + (Z_{0L} + Z_{S2})I_0 - (A \times Z_{0M})I_0}{Z_{0M} - (AZ_0)} \quad (3)$$

$$\text{where } A = \frac{(1-d)Z_{0L} + Z_{S2}}{(1-d)Z_{0M}} \quad (4)$$

where:
$V_{A0}$ is the zero-sequence voltage at a local terminal (i.e., the terminal of the second line closer to the device);
$I_0$ is the second zero-sequence current in the second line;
d is an estimated fractional fault location from a local terminal;
$Z_{0L}$ is a positive sequence impedance of the second line;
$Z_{0M}$ is a zero-sequence mutual impedance of the first and second line;
$Z_{S2}$ is a source impedance behind the remote terminal.

Alternatively or additionally, the device may be operative such that estimating the first zero-sequence current may comprise, independently of whether the first line is in service and/or independently of whether the transformers are in the wye grounded-wye grounded configuration or in the delta-wye grounded configuration, estimating the first zero-sequence current I'$_0$ such that it fulfils $$I'_0 = \frac{(Z_{S1} + Z_{0L} + Z_{S2}) - (AZ_{0M})}{Z_{0M} - (AZ_0)} I_0 \quad (5)$$

$$\text{where } A = \frac{(1-d)Z_{0L} + Z_{S2}}{(1-d)Z_{0M}} \quad (6)$$

where:
$I_0$ is the second zero-sequence current in the second line;
d is an estimated fractional fault location from a local terminal;
$Z_{0L}$ is a positive sequence impedance of the second line;
$Z_{0M}$ is a zero-sequence mutual impedance of the first and second line;
$Z_{S2}$ are source impedances behind the local and remote terminals, respectively.

The estimated fractional fault location can be obtained as described in more detail below, and can be iteratively improved in an iterative process that includes an initiation step and at least one further iteration, as will be described below.

Equations (3), (4) or equations (5), (6) can be derived for a certain parallel line status and transformer configuration, but surprisingly provide robust estimates and robust distance protection function that uses mutual coupling compensation independently of whether the first line 11 (i.e., the line 11 that is parallel to the line 12 protected by the device 20) is open and grounded or in operation, and independently of the transformer configurations at the local and remote terminals. Implementations that use equations (3), (4) or equations (5), (6) provide the effect of implementing reliable mutual coupling compensation without requiring information on whether the first line 11 (i.e., the line 11 that is parallel to the line 12 protected by the device 20) is open and grounded or in operation, and without requiring information on the transformer configurations at the local and remote terminals.

Estimation That Takes Into Account Parallel Line Status and Transformer Configuration Estimation of zero-sequence current in the healthy first line can be achieved using a zero-sequence equivalent circuit of the double-circuit transmission line system during a fault on the line being protected.

The zero-sequence equivalent circuit depends on (1) a configuration of transformers at both terminals of the double-circuit line and (2) a status of circuit breakers at local as well as remote ends of both the lines. This information can be obtained as input from digital substation data and can be used to determine how (i.e., using which expressions or data processing routines) the zero-sequence current in the first line (also referred to as "first zero-sequence impedance") is determined.

The most common transformer configuration when connecting generating stations is delta-wye grounded. Similarly, the most common transformer configuration when connecting sub-stations is wye-wye grounded. Further, the two common configurations of double circuit lines are—both lines in operation, and, one line in operation while the other line is open and grounded. The formation of equivalent circuit and estimation of current for the first line for each of the above-mentioned configurations is explained below.

The following notation is used below:
I'$_0$: zero-sequence current in the line parallel to the line being protected (also referred to as "first zero-sequence current");
I$_0$: zero-sequence current in the line being protected (also referred to as "second zero-sequence current");

$V_{A0}$: zero-sequence voltage at a local terminal of the line being protected (also referred to as local zero-sequence voltage);

$I_F$: fault current flowing into a fault resistance;

d: fractional fault location from the local terminal (the "fractional" fault location designates the fraction of the zero-sequence impedance of the line after which the fault occurs);

$Z_1$, $Z_{0L}$: positive sequence and zero-sequence impedance of the line;

$Z_{0m}$: mutual impedance of the first and second lines;

$Z_{T1}$, $Z_{T2}$: transformer impedances of the transformers at the local and remote terminals, respectively (index 1 designates the transformer at the local terminal, i.e., the terminal close to the protection device that performs the protection function, while index 2 designates the transformer at the remote terminal);

$Z_{S1}$, $Z_{S2}$: source impedances behind the local and remote terminals, respectively (index 1 designates the source at the local terminal, i.e., the terminal close to the protection device that performs the protection function, while index 2 designates the source at the remote terminal).

The dependency of the zero-sequence current in the line parallel to the line being protected (also referred to as "first zero-sequence current") on the measured zero-sequence current in the line being protected (also referred to as "second zero-sequence current"), respectively for different status of the first line 11 and for different transformer configurations, will be discussed below.

First Line Open and Grounded

Transformer Configuration: Delta-Wye Grounded

Figure 6:
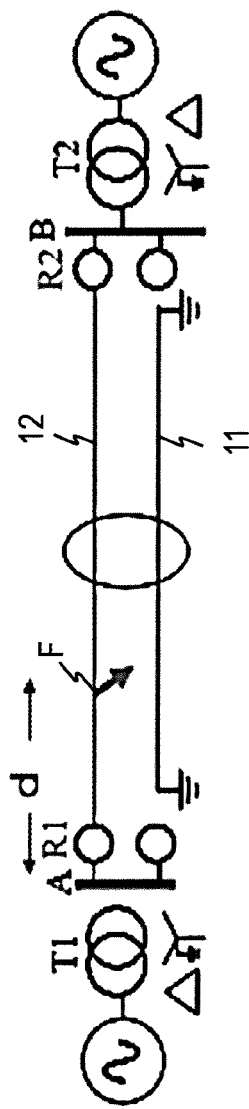
FIG. 6 is a schematic representation of a system comprising double-circuit lines with a delta-wye grounded transformer configuration and a first line that is open and grounded.
Figure 7:
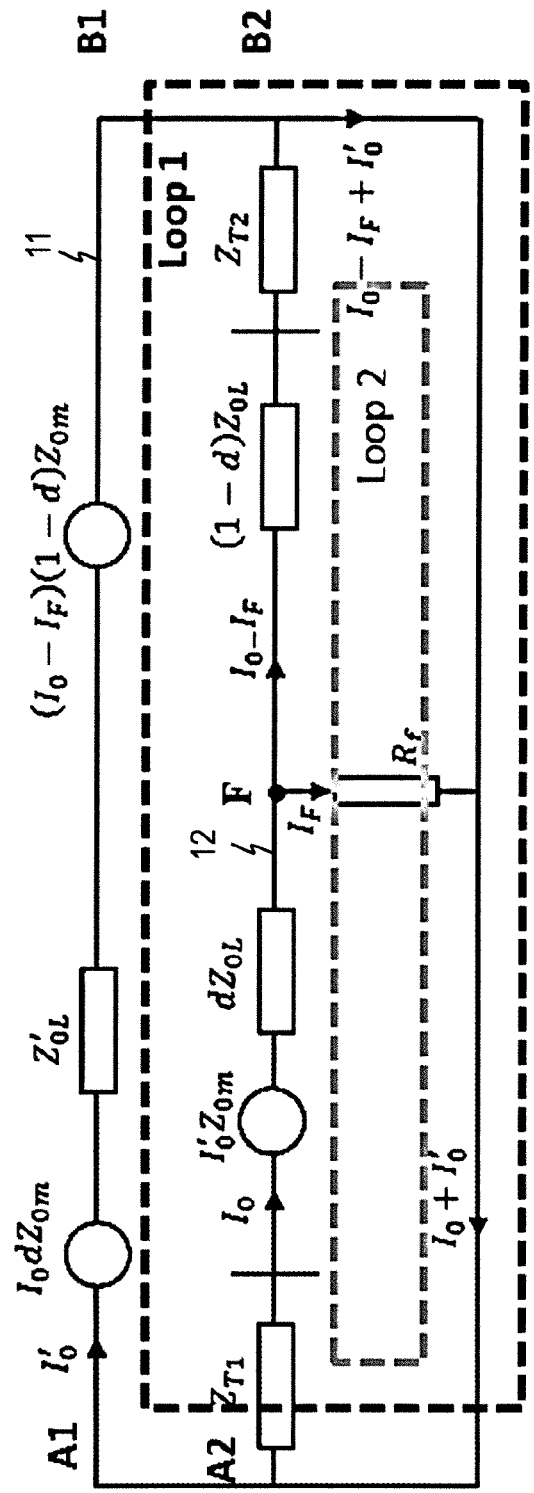
FIG. 7 is an equivalent zero-sequence network of the double-circuit line for the system state and configuration of FIG. 6.

The equivalent zero-sequence network of the double circuit line with healthy first line 11 open and grounded (FIG. 6) is shown in FIG. 7. The transformer configurations at both terminals are delta-wye grounded. The fault is at distance d from terminal A on the line in operation 12 that is being protected by the protection relay R1.

In FIG. 7, the upper branch A1-B1 represents the healthy first line 11 which is open and grounded. $I'_0$ is the zero-sequence current in the first line. $I_0 \times d \times Z_{0m}$ is the voltage induced by current $I_0$ in the section before fault point F. $(I_0-I_F) \times (1-d) \times Z_{0m}$ induced voltage by current $(I_0-I_F)$ in the section after fault point F.

The lower branch A2-B2 represents the line 12 in operation which is being protected. $I_0$ is zero-sequence current in the line being protected. $I'_0 \times Z_{0m}$ is the voltage induced in the line 12 by the current $I'_0$ in the first line 11.

Applying Kirchhoff's rule to loop 1 and loop 2 (as shown in FIG. 7) leads to Equations (7) and (8) below.

$$Z_{0L}I'_0 - Z_{0M}I_0 + (1-d)Z_{0M}I_F = 0 \quad (7)$$

$$(Z_{T1}+Z_{0L}+Z_{T2})I'_0 - ((1-d)Z_0+Z_{T2})I_F - Z_{0M}I'_0 = 0 \quad (8)$$

These expressions are derived for parallel lines having substantially the same line impedance, i.e., $Z_{0L} \approx Z'_{0L}$. This is a good approximation for, e.g., lines of the same material and diameter extending in parallel in a power transmission network.

The unknown fault current $I_F$ can be derived from Equation (7) as shown in Equation (9) below, $$I_F = \frac{-Z_{0L}I'_0 + Z_{0M}I_0}{(1-d)Z_{0M}} \quad (9)$$

Substituting for fault current $I_F$ from Equation (9) into Equation (8), the first zero-sequence current in the first line 11 parallel to the line 12 being protected can be expressed as $$I'_0 = \frac{(Z_{T1}+Z_{0L}+Z_{T2})-(A \times Z_{0M})}{Z_{0M}-(A \times Z_0)} \times I_0 \quad (10)$$

where, $$A = \frac{(1-d)Z_{0L}+Z_{T2}}{(1-d)Z_{0M}} \quad (11)$$

Thus, the zero-sequence current in the first line 11 is expressed as a function of fault location, system impedance (more specifically: transformer impedances) and line impedances (zero-sequence impedance $Z_{0L}$ and zero-sequence mutual impedance $Z_{0M}$) and the zero-sequence current $I_0$ derived from the current measured at the line 12 being protected.

When $V_{A0}$, the zero-sequence voltage at a local terminal of the line 12 being protected by the device 20, is obtained by measurement, the first zero-sequence current in the first line 11 parallel to the line 12 being protected can be expressed as $$I'_0 = \frac{V_{A0}+(Z_{0L}+Z_{T2}) \times I_0 - A(Z_{0L}-Z_{0M}) \times I_0}{A(Z_{T2}-Z_{0L})-Z_{T2}+Z_{0M}} \quad (12)$$

where $$A = \frac{(1-d)Z_{0L}+Z_{T2}}{(1-d)Z_{0M}-Z_{T2}} \quad (13)$$

Using Equations (12), (13), the zero-sequence current in the first line 11 is determined as a function of fault location, system impedance (more specifically: remote transformer impedance), line impedances (zero-sequence impedance $Z_{0L}$ and zero-sequence mutual impedance $Z_{0M}$), the zero-sequence current $I_0$ derived from the current measured at the line 12 being protected, and the zero-sequence voltage at the local terminal of the line 12.

Transformer Configuration: Wye Grounded—Wye Grounded

Figure 8:
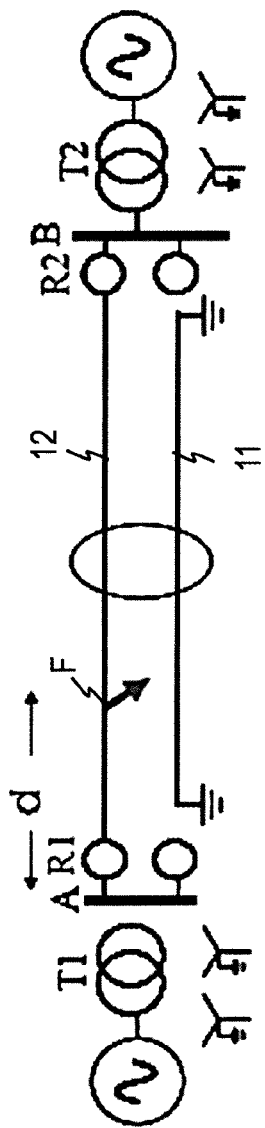
FIG. 8 is a schematic representation of a system comprising double-circuit lines with a wye grounded—wye grounded transformer configuration and a first line that is open and grounded.
Figure 9:
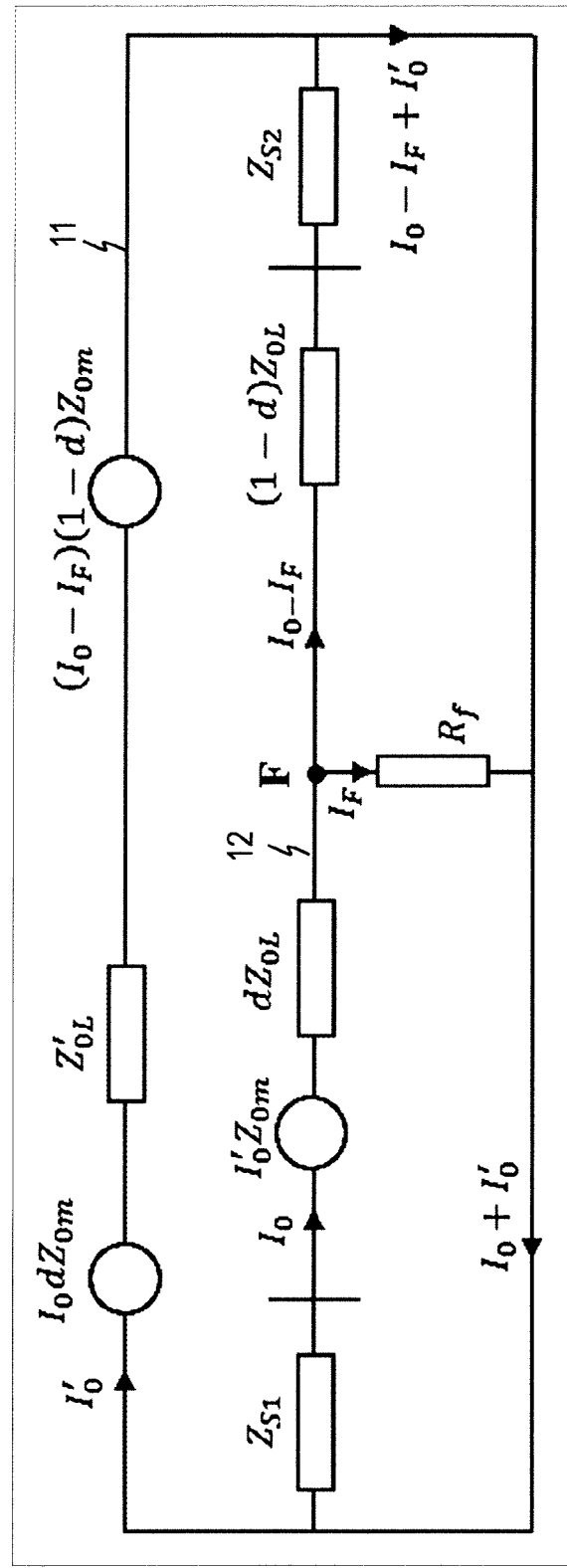
FIG. 9 is an equivalent zero-sequence network of the double-circuit line for the system state and configuration of FIG. 8.

The equivalent zero-sequence network of the double circuit line with healthy first line 11 open and grounded (FIG. 8) is shown in FIG. 9. The transformer configurations at both terminals are wye grounded—wye grounded. The fault is at distance d from terminal A on the line 12 in operation.

The dependency of the zero-sequence current in the first line 11 on the zero-sequence current in the line 12 being protected can be estimated using similar techniques as described above. The expression is given in Equation (14).

$$I'_0 = \frac{(Z_{S1}+Z_{0L}+Z_{S2})-(A \times Z_{0M})}{Z_{0M}-(A \times Z_0)} \times I_0 \quad (14)$$

where, $$A = \frac{(1-d)Z_{0L}+Z_{S2}}{(1-d)Z_{0M}} \quad (15)$$

Thus, the zero-sequence current in the first line 11 is expressed as a function of fault location, system impedances (in particular source impedances) and line impedances and the zero-sequence current derived from the current measured at the line 12 being protected.

When $V_{A0}$, the zero-sequence voltage at a local terminal of the line 12 being protected by the device 20, is obtained by measurement, the first zero-sequence current in the first line 11 parallel to the line 12 being protected can be expressed as $$I_0' = \frac{V_{A0} + (Z_{0L} + Z_{S2})I_0 - A(Z_{0L} - Z_{0M})I_0}{A(Z_{S2} - Z_{0L}) - Z_{S2} + Z_{0M}} \quad (16)$$

where $$A = \frac{(1-d)Z_{0L} + Z_{S2}}{(1-d)Z_{0M} - Z_{S2}} \quad (17)$$

Using Equations (16), (17), the zero-sequence current in the first line 11 is determined as a function of fault location, system impedance (more specifically: remote source impedance), line impedances (zero-sequence impedance $Z_{0L}$ and zero-sequence mutual impedance $Z_{0M}$), the zero-sequence current $I_0$ derived from the current measured at the line 12 being protected, and the zero-sequence voltage at the local terminal of the line 12.

Both Lines 11, 12 in Operation

Transformer Configuration: Delta-Wye Grounded

Figure 10:
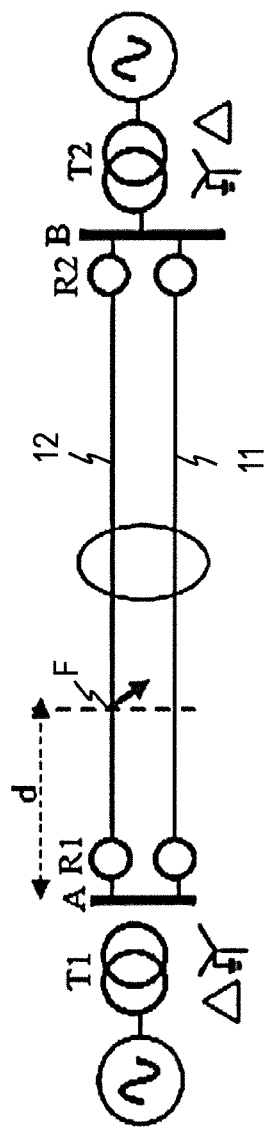
FIG. 10 is a schematic representation of a system comprising double-circuit lines with a delta-wye grounded transformer configuration and a first line that is in service.
Figure 11:
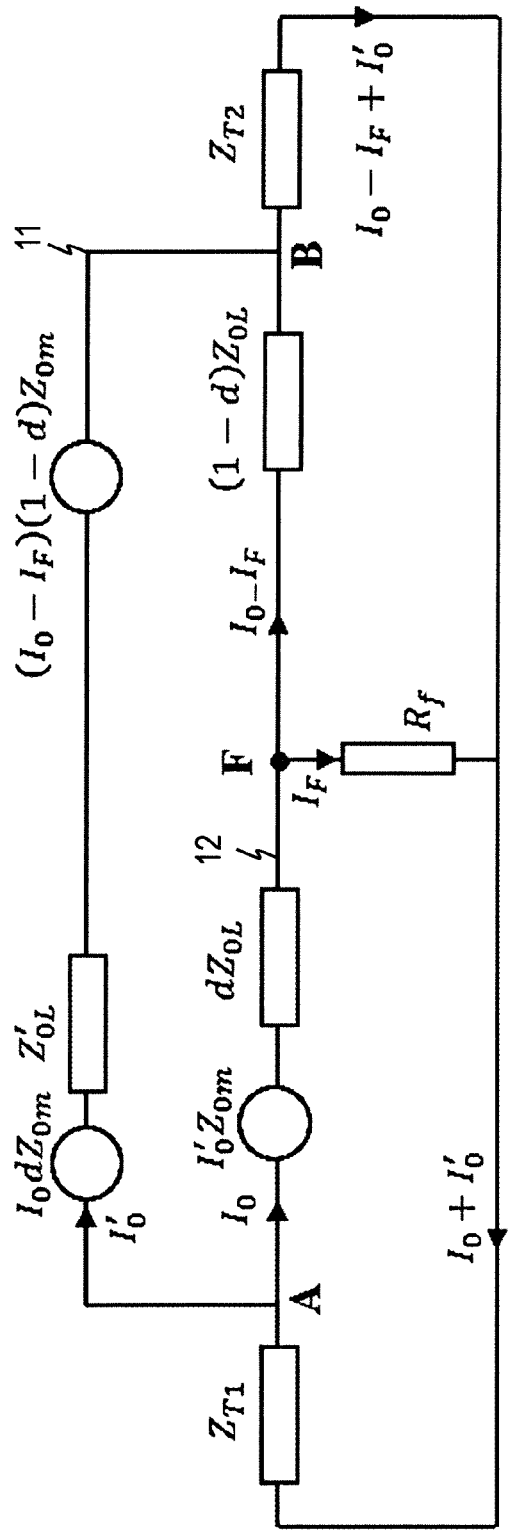
FIG. 11 is an equivalent zero-sequence network of the double-circuit line for the system state and configuration of FIG. 10.

The equivalent zero-sequence network of the double circuit line with healthy first line 11 in service (FIG. 10) is shown in FIG. 11. The transformer configurations at both terminals are delta-wye grounded. The fault F is at distance d from terminal A on the line 12 in operation that is being protected by the protection device (e.g., the relay R1).

The dependency of the zero-sequence current in the first line 11 on the zero-sequence current in the line 12 being protected can be estimated using similar techniques as described above. The expression is given in Equation (18).

$$I_0' = \frac{(Z_{T1} + Z_{0L} + Z_{T2}) - A(Z_{0L} - Z_{0M})}{A(Z_{T1} + Z_{T2} - Z_{0L}) - Z_{T1} - Z_{T2} + Z_{0M}} I_0 \quad (18)$$

where, $$A = \frac{(1-d)Z_{0L} + Z_{T2}}{(1-d)Z_{0M} - Z_{T2}} \quad (19)$$

Thus, the zero-sequence current in the first line 11 is expressed as a function of fault location, system impedance (more specifically: transformer impedances) and line impedances (zero-sequence impedance $Z_{0L}$ and zero-sequence mutual impedance $Z_{0M}$) and the zero-sequence current $I_0$ derived from the current measured at the line 12 being protected.

When $V_{A0}$, the zero-sequence voltage at a local terminal of the line 12 being protected by the device 20, is obtained by measurement, the first zero-sequence current in the first line 11 parallel to the line 12 being protected can be expressed as $$I_0' = \frac{V_{A0} + (Z_{0L} + Z_{T2})I_0 - (AZ_{0M})I_0}{Z_{0M} - (AZ_0)} \quad (20)$$

where $$A = \frac{(1-d)Z_{0L} + Z_{T2}}{(1-d)Z_{0M}} \quad (21)$$

Using Equations (20), (21), the zero-sequence current in the first line 11 is determined as a function of fault location, system impedance (more specifically: remote transformer impedance), line impedances (zero-sequence impedance $Z_{0L}$ and zero-sequence mutual impedance $Z_{0M}$), the zero-sequence current $I_0$ derived from the current measured at the line 12 being protected, and the zero-sequence voltage at the local terminal of the line 12.

Transformer Configuration: Wye Grounded—Wye Grounded

Figure 12:
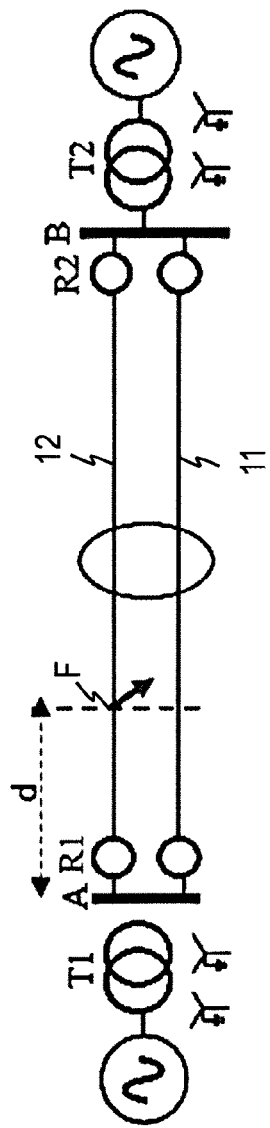
FIG. 12 is a schematic representation of a system comprising double-circuit lines with a wye grounded—wye grounded transformer configuration and a first line that is in service.
Figure 13:
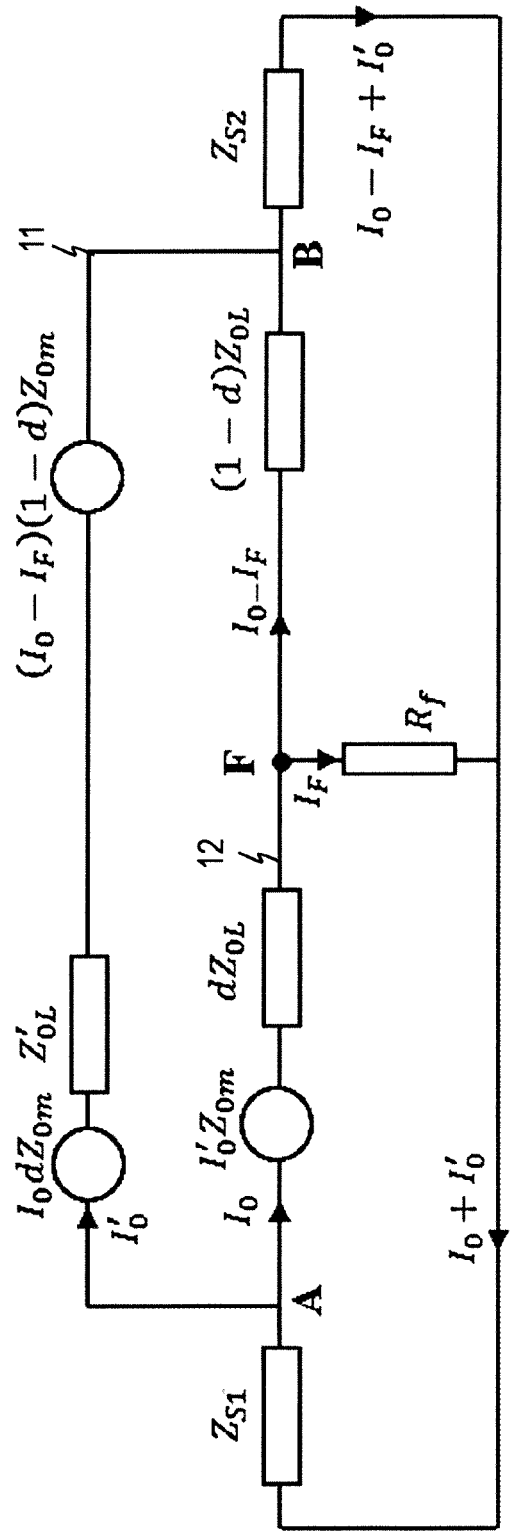
FIG. 13 is an equivalent zero-sequence network of the double-circuit line for the system state and configuration of FIG. 12.

The equivalent zero-sequence network of the double circuit line with healthy first line 11 in service (FIG. 12) is shown in FIG. 13. The transformer configurations at both terminals are wye grounded—wye grounded. The fault F is at distance d from terminal A on the line 12 in operation that is being protected by the protection device (e.g., the relay R1).

The dependency of the zero-sequence current in the first line 11 on the zero-sequence current in the line 12 being protected can be estimated using similar techniques as described above. The expression is given in Equation (22).

$$I_0' = \frac{(Z_{S1} + Z_{0L} + Z_{S2}) - A(Z_{0L} - Z_{0M})}{A(Z_{S1} + Z_{S2} - Z_{0L}) - Z_{S1} - Z_{S2} + Z_{0M}} I_0 \quad (22)$$

where, $$A = \frac{(1-d)Z_{0L} + Z_{S2}}{(1-d)Z_{0M} - Z_{S2}} \quad (23)$$

Thus, the zero-sequence current in the first line 11 is expressed as a function of fault location, system impedances (in particular source impedances) and line impedances and the zero-sequence current $I_0$ derived from the current measured at the line 12 being protected.

When $V_{A0}$, the zero-sequence voltage at a local terminal of the line 12 being protected by the device 20, is obtained by measurement, the first zero-sequence current in the first line 11 parallel to the line 12 being protected can be expressed as $$I_0' = \frac{V_{A0} + (Z_{0L} + Z_{S2})I_0 - (AZ_{0M})I_0}{Z_{0M} - (AZ_0)} \quad (24)$$

where $$A = \frac{(1-d)Z_{0L} + Z_{S2}}{(1-d)Z_{0M}} \quad (25)$$

Using Equations (24), (25), the zero-sequence current in the first line 11 is determined as a function of fault location, system impedance (more specifically: remote source impedance), line impedances (zero-sequence impedance $Z_{0L}$ and zero-sequence mutual impedance $Z_{0M}$), the zero-sequence current $I_0$ derived from the current measured at the line 12 being protected, and the zero-sequence voltage at the local terminal of the line 12.

(B) Mutual Coupling Compensation Using the Estimated First Zero-Sequence Current As explained above, zero-sequence mutual coupling compensation is achieved by adding a relevant term to the relay measuring current proportional to the zero-sequence current of the first line 11. The way in which the first zero-sequence current can be estimated using local measurements from the line being protected and from impedance parameters has been described above. This section describes how the estimated current can be used to achieve adaptive zero-sequence mutual coupling compensation.

The expression for the first zero-sequence current is a function of the unknown fault location, d, as shown in equations (3)-(6) and (10)-(25). Hence, the mutual coupling compensation can be performed is an iterative procedure. The mutual coupling compensation can be performed as a two-step procedure.

As a first step, an initial estimate of the unknown fault location can be obtained using a conventional apparent impedance calculated using Equation (26) below, which does not take into account mutual coupling.

An initial estimate for the apparent impedance $Z_{app,in}$ is divided by the total positive sequence line impedance $Z_1$ to obtain the initial estimate of fractional fault location (equation (27)).

$$Z_{app,in} = \frac{U_{ph}}{I_{ph} + K_0 I_0} \quad (26)$$

$$d = \frac{Z_{app,in}}{Z_1} \quad (27)$$

As a next step, using the calculated initial estimate of the fault location $d_{in}$, the zero-sequence current $I'_0$ in the first line 11 is estimated.

The estimation of the zero-sequence current $I'_0$ in the first line 11 may be performed independently of the line configuration and transformer configuration, using any one of Equations (3), (4) or (5), (6), for example.

Alternatively, the estimation of the zero-sequence current $I'_0$ in the first line 11 may be performed by selecting the appropriate procedure based on the line and transformer configurations. Possible expressions for the zero-sequence current in the first line 11 (i.e., the "first zero-sequence current) are summarized in the two tables below for each of the configurations explained above.

The expression may be selected from the following table that relates to the case where a zero-sequence voltage at the local terminal is used.

| Line configuration | Transformer configuration | Expression for $I_0'$ |
|---|---|---|
| Both lines in service | Delta-wye grounded | $I'_0 = \frac{V_{A0} + (Z_{0L} + Z_{T2})I_0 - (AZ_{0M})I_0}{Z_{0M} - (AZ_0)}$ <br> where, $A = \frac{(1-d)Z_{0L} + Z_{T2}}{(1-d)Z_{0M}}$ |
|  | wye grounded-wye grounded | $I'_0 = \frac{V_{A0} + (Z_{0L} + Z_{S2})I_0 - (AZ_{0M})I_0}{Z_{0M} - (AZ_0)}$ <br> where, $A = \frac{(1-d)Z_{0L} + Z_{S2}}{(1-d)Z_{0M}}$ |
| First line open and grounded | Delta-wye grounded | $I'_0 = \frac{V_{A0} + (Z_{0L} + Z_{T2})I_0 - A(Z_{0L} - Z_{0M})I_0}{A(Z_{T2} - Z_{0L}) - Z_{T2} + Z_{0M}}$ <br> where, $A = \frac{(1-d)Z_{0L} + Z_{T2}}{(1-d)Z_{0M} - Z_{T2}}$ |
|  | wye grounded-wye grounded | $I'_0 = \frac{V_{A0} + (Z_{0L} + Z_{S2})I_0 - A(Z_{0L} - Z_{0M})I_0}{A(Z_{S2} - Z_{0L}) - Z_{S2} + Z_{0M}}$ <br> where, $A = \frac{(1-d)Z_{0L} + Z_{S2}}{(1-d)Z_{0M} - Z_{S2}}$ |

The expression may be selected from the following table that relates to the case where a zero-sequence voltage at the local terminal is not used.

| Line configuration | Transformer configuration | Expression for $I_0'$ |
|---|---|---|
| Both lines in service | Delta-wye grounded | $I'_0 = \frac{(Z_{T1} + Z_{0L} + Z_{T2}) - (AZ_{0M})}{Z_{0M} - (AZ_0)} \times I_0$ <br> where, $A = \frac{(1-d)Z_{0L} + Z_{T2}}{(1-d)Z_{0M}}$ |
|  | wye grounded-wye grounded | $I'_0 = \frac{(Z_{S1} + Z_{0L} + Z_{S2}) - (AZ_{0M})}{Z_{0M} - (AZ_0)} I_0$ <br> where, $A = \frac{(1-d)Z_{0L} + Z_{S2}}{(1-d)Z_{0M}}$ |
| First line open and grounded | Delta-wye grounded | $I'_0 = \frac{(Z_{T1} + Z_{0L} + Z_{T2}) - A(Z_{0L} - Z_{0M})}{A(Z_{T1} + Z_{T2} - Z_{0L}) - Z_{T1} - Z_{T2} + Z_{0M}} \times I_0$ <br> where, $A = \frac{(1-d)Z_{0L} + Z_{T2}}{(1-d)Z_{0M} - Z_{T2}}$ |
|  | wye grounded-wye grounded | $I'_0 = \frac{(Z_{S1} + Z_{0L} + Z_{S2}) - A(Z_{0L} - Z_{0M})}{A(Z_{S1} + Z_{S2} - Z_{0L}) - Z_{S1} - Z_{S2} + Z_{0M}} I_0$ <br> where, $A = \frac{(1-d)Z_{0L} + Z_{S2}}{(1-d)Z_{0M} - Z_{S2}}$ |

The respective equation (irrespective of whether or not it takes line status and transformer configuration into account)

is initially evaluated with the fault location estimate obtained according to Equations (26) and (27).

When the zero-sequence current in the first line 11 is estimated, the apparent impedance is updated using Equation (28) below. The zero-sequence current in the first line 11 is used as $I_0'$ in the following expression (28) at that step:

$$Z_{app} = \frac{U_{ph}}{I_{ph} + K_0 I_0 + K_{0m} I_0'} \quad (28)$$

$$\text{where, } K_0 = \frac{Z_{0L} - Z_1}{Z_1}, K_{0m} = \frac{Z_{0m}}{Z_{0L}}$$

Subsequently, the fault location estimate is updated by replacing the $Z_{in}$ in equation (27) by $Z_{app}$ according to Equation (28). An updated estimate for the fault location can be determined as $$d = \frac{Z_{app}}{Z_1} \quad (29)$$

With the updated fault location estimate of Equation (29), an updated estimate of the first line current can be obtained using one of the expressions given in the table above (with the appropriate expression being selected in dependence on line status and transformer configuration). An updated value of the apparent impedance is determined using Equation (28) (using the updated estimated zero-sequence current for $I_0'$).

This updated apparent impedance can be output as the final apparent impedance and/or can be used for implementing a protection function.

While an iterative procedure has been described which involves an initialization step and then just one further iteration, iterative procedures with two, three or more than three iterations may be implemented. However, as will be described in more detail with reference to FIGS. 15 to 19, an iterative procedure as described above and in FIG. 14 provides very good results.

Figure 14:
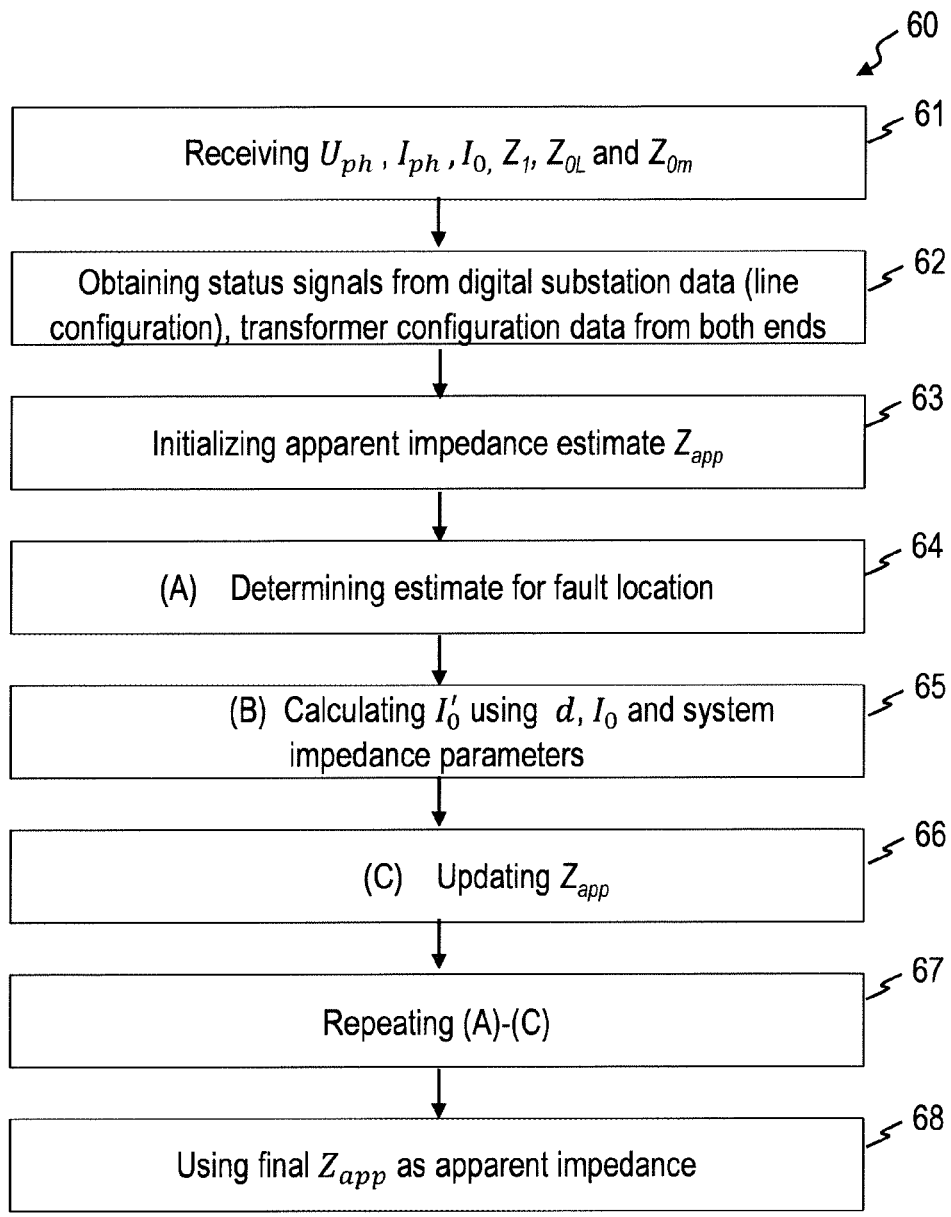
FIG. 14 is a flow chart of a method.

FIG. 14 is a flow chart of a method 60. The method 60 may be performed by the protection device 20.

At step 61, measurements for the line being protected are received. The measurements may include values for, or may allow the protection device to derive, $U_{ph}$, $I_{ph}$, and $I_0$. The measurements may include a value for, or may allow the protection device to derive the zero-sequence voltage at the local terminal.

The protection device may also retrieve the positive sequence impedance $Z_1$ for the line being protected, the zero-sequence impedance $Z_{0L}$ for the line being protected, and the mutual impedance $Z_{0m}$ for the lines 11, 12 (in the unfaulted state). These system impedance parameters (as well as source and/or transformer impedances) may be stored locally in the protection device 20 or may be retrieved by the protection device from a separate storage system.

At step 62, a status of the line 11 extending parallel to the line 12 that is being protected by the device 20 may optionally be determined. The determination may comprise obtaining status signals or status information. This information may be obtained from digital substation data.

At step 62, a transformer configuration may optionally be obtained. The transformer configuration may be obtained from a substation configuration description, may be specified by an operator, or may be otherwise provided.

As explained above, step 62 is optional. The device 20 may be operative to determine the estimate for the first zero-sequence current, to determine the estimate for the apparent impedance and/or to perform mutual coupling compensation independently of the status of the line 11 extending parallel to the line 12 that is being protected and/or independently of the transformer configuration.

At step 63, an estimate for the apparent impedance may be initialized. The apparent impedance estimate may be initialized according to Equation (27), i.e., without regard to mutual coupling.

At step 64, an estimate for the fault location in the line being protected may be initialized. The initial value for the fault location may be determined according to Equation (28).

At step 65, an initial estimate for the zero-sequence current in the first line may be determined, using the zero-sequence current in the line that is being protected derived from a measurement, the fault location estimate previously obtained, and system impedance parameters. The way in which the initial estimate for the zero-sequence current depends on the zero-sequence current derived from the current measurement in the line that is being protected, the fault location estimate previously obtained, and system impedance parameters may be independent or may be dependent on (i) the status of the first line (in service or open and grounded) and (ii) the transformer configuration, as explained above.

At step 66, the estimate for the apparent impedance is updated, using the previously obtained estimate for the zero-sequence current in the first line. This may be done using Equation (28).

At step 67, refined estimates may be determined for the fault location (using Equation (29) with the previously determined estimate for the apparent impedance), the zero-sequence current in the line 11 parallel to the line that is being protected are determined. This may again be done using Equations (3), (4) (which are independent on (i) the status of the first line (in service or open and grounded) and (ii) the transformer configuration), Equations (5), (6) (which are independent on (i) the status of the first line (in service or open and grounded) and (ii) the transformer configuration), or using an appropriate one of Equations (10)-(24) (it being understood that the definitions of A are respectively associated with the expressions for the zero-sequence current) selected in dependence on (i) the status of the first line (in service or open and grounded) and (ii) the transformer configuration).

While one iteration typically provides very good results, as will be explained below, several iterations may be performed by repeating step 67.

At step 68, the last estimate for the apparent impedance may be used as apparent impedance. The apparent impedance may be output and/or may be used for performing a protection function. Mutual coupling compensation is performed by taking into account the mutual coupling in accordance with, e.g., Equation (28).

EXAMPLE

Figure 15:
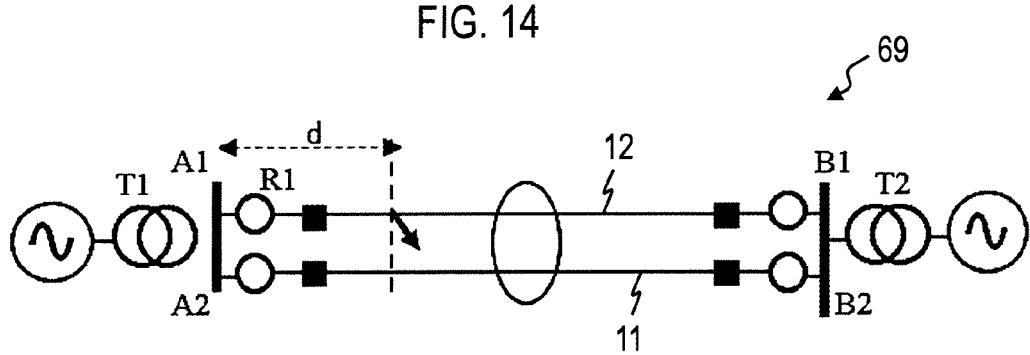
FIG. 15 is a schematic representation of a system comprising double-circuit transmission systems lines and a protection device, for which the data of FIGS. 16 to 19 are obtained.

This section presents the results obtained using a protection device and method according to an embodiment. A 50 Hz, 400 kV double-circuit transmission line system 69 of 200 km length as shown in FIG. 15 is modelled using Power Systems CAD (PSCAD). The impedance parameters are given below.

| Impedance parameters | Value |
| --- | --- |
| Positive sequence impedance | 0.36 < 84.9° ohms/km |
| Zero-sequence impedance | 1.41 < 82.8° ohms/km |
| Zero-sequence mutual impedance | 0.95 < 80.6 ohms/km |
| Transformer positive sequence impedance | 42.35 < 59 ohms |

Line A1-B1 is the line being protected by relay R1. The voltage and current measurements from terminal A1 of line A1-B1 as well as the line and system impedance parameters are taken as input. Additionally, the status signals from the digital substation data are used to determine the line configuration. Transformer configurations at both terminals are also acquired.

Different combinations of line and transformer configurations are tested, and the results are discussed below.

First Line Open and Grounded
Transformer Configuration: Delta-Wye Grounded

Figure 16:
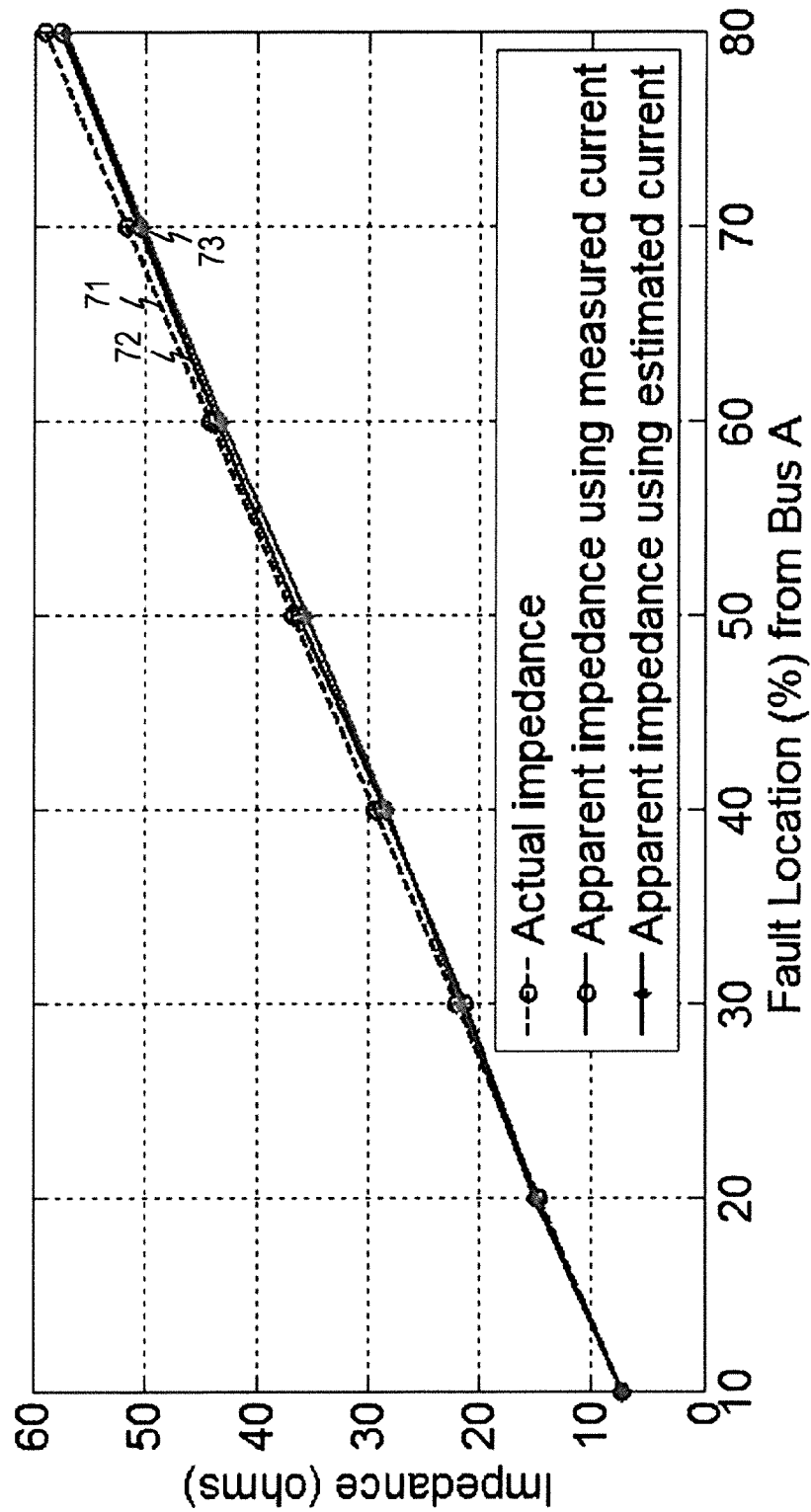
FIG. 16 is a diagram showing actual impedance, apparent impedance obtained when using a current measurement at a first line and apparent impedance obtained when estimating a zero-sequence current in the first line using the disclosed techniques, for a delta-wye grounded transformer configuration and the first line being open and grounded.

FIG. 16 shows values and plots of the apparent impedance calculated for faults at different locations on the second line 12 in FIG. 15. The fault location is determined as fractional fault location (i.e., the portion of the line impedance, relative to the total line impedance, prior to the fault, as measured from the terminal at which the protection device is arranged).

FIG. 16 shows the actual impedance 71 as seen by the protection device R1.

FIG. 16 shows the apparent impedance 73 (shown by solid lines and filled diamond symbols) that is obtained using a protection device or method according to an embodiment. More specifically, the apparent impedance 73 is obtained using the method of FIG. 13, with just one iteration being performed at step 67. The apparent impedance 73 is obtained without any current measurement for the first line 11.

FIG. 16 shows the apparent impedance 72 (shown by solid lines and unfilled circles) that is obtained using a method in which the first zero-sequence current in the first line 11 is derivable from a measurement.

As can be seen from FIG. 16, the apparent impedance 73 obtained using a protection device or method according to an embodiment is in excellent agreement with the apparent impedance 72 that uses the actual current measurement from the first line 11. Thus, the protection device and method of embodiments provide results that are comparable to those obtained when using the actual current measurement from the first line 11, while obviating the need to transfer such a current measurement from a current transformer on the first line 11 to the protection device R1 that provides a protection function of the line 12.

The apparent impedance 73 also provides a good approximation of the actual impedance obtained by the PSCAD. The apparent impedance calculated using the estimated current is very close to the impedance calculated using the measured one and does not deviate more strongly from the actual impedance 71 than the apparent impedance 73 calculated using the measured current from the other line. This proves the accuracy of the proposed algorithm.

Transformer Configuration: Wye Grounded—Wye Grounded

Figure 17:
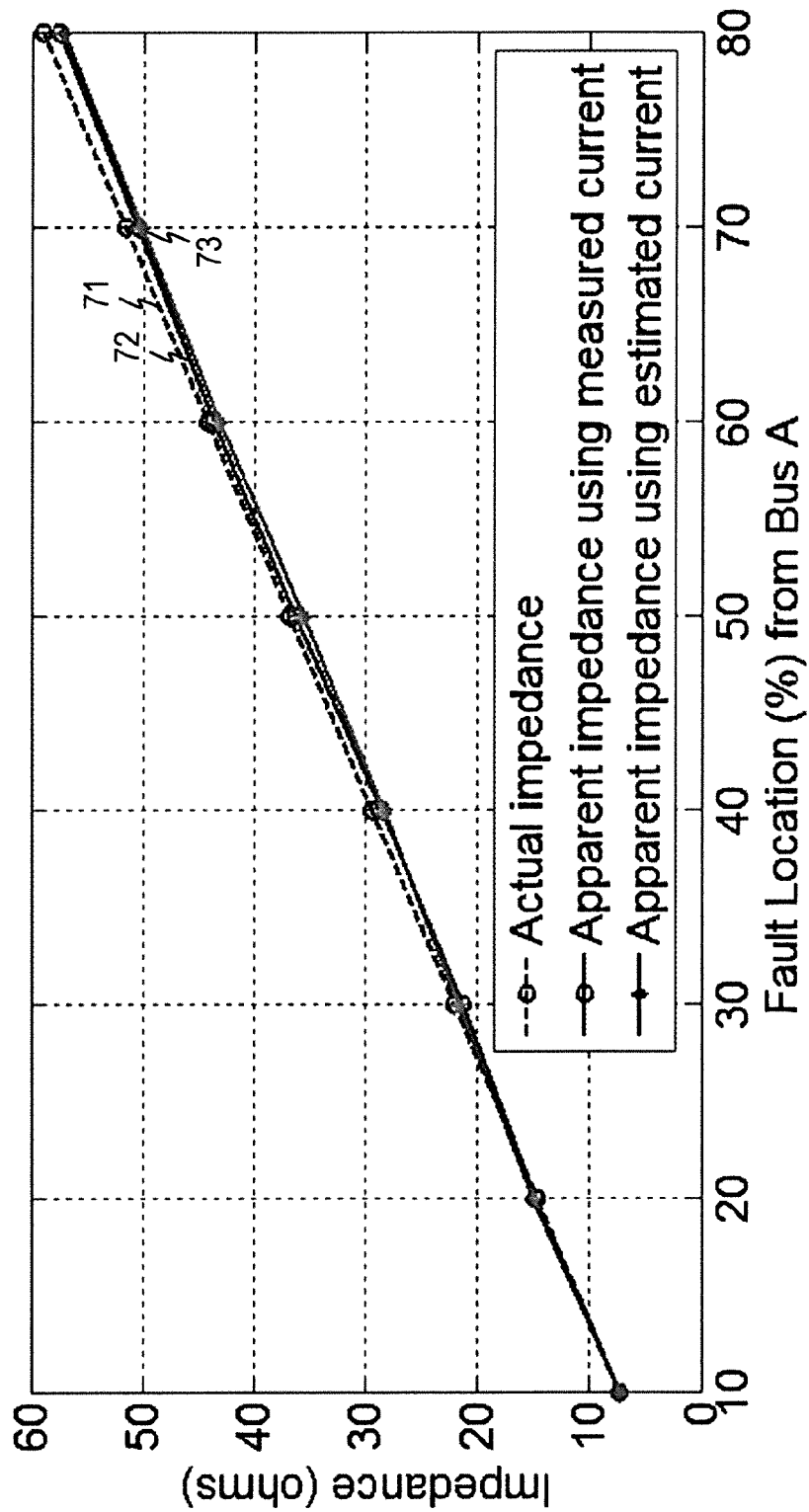
FIG. 17 is a diagram showing actual impedance, apparent impedance obtained when using a current measurement at a first line and apparent impedance obtained when estimating a zero-sequence current in the first line using the disclosed techniques, for a wye grounded—wye grounded transformer configuration and the first line being open and grounded.

Similarly, FIG. 17 shows the apparent impedance calculated for faults at different locations on the second line 12 when the first line 11 is open and grounded and transformer configuration is wye-wye grounded. Shown are the actual impedance 71, the apparent impedance 72 calculated using current measured from the first line, and the apparent impedance 73 calculated using the estimated first line current as in the proposed solution, as obtained by a protection device and method according to an embodiment. The apparent impedance 73 calculated using the estimated currents is very close to the apparent impedance 72 calculated using the measured current, while obviating the need for obtaining the current measurement from a line that is parallel to the line protected by the protection device that performs the mutual coupling compensation.

Both Lines in Operation
Transformer Configuration: Delta-Wye Grounded

Figure 18:
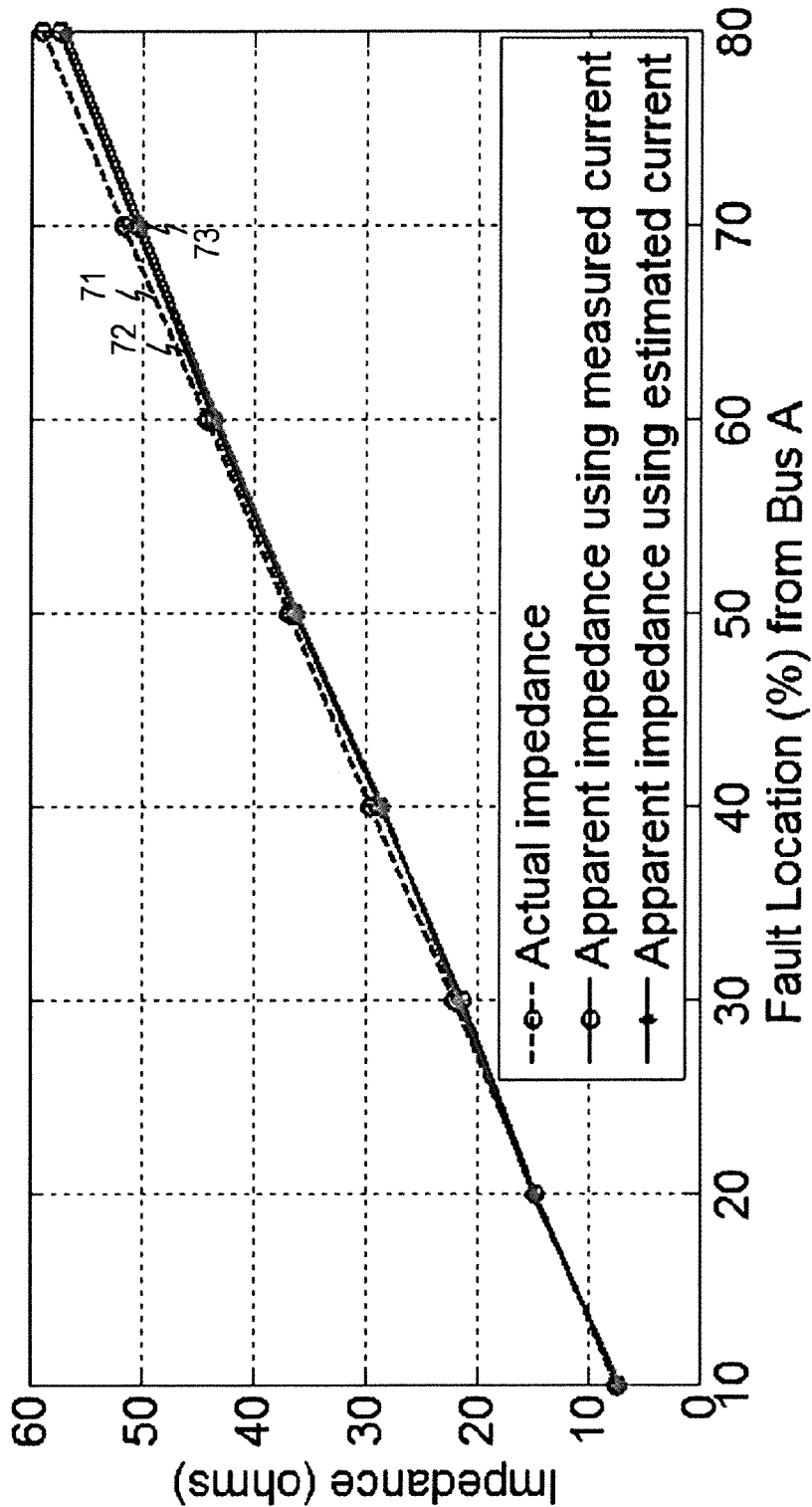
FIG. 18 is a diagram showing actual impedance, apparent impedance obtained when using a current measurement at a first line and apparent impedance obtained when estimating a zero-sequence current in the first line using the disclosed techniques, for a delta-wye grounded transformer configuration and the first line being in service.

FIG. 18 shows the apparent impedance calculated for faults at different locations on the second line 12 when both lines 11, 12 are in operation and the transformer configuration is delta-wye grounded. Shown are the actual impedance 71, the apparent impedance 72 calculated using current measured from the first line, and the apparent impedance 73 calculated using the estimated first line current as in the proposed solution, as obtained by a protection device and method according to an embodiment. The apparent impedance 73 calculated using the estimated currents is very close to the apparent impedance 72 calculated using the measured current, while obviating the need for obtaining the current measurement from a line that is parallel to the line protected by the protection device that performs the mutual coupling compensation.

Transformer Configuration: Wye Grounded—Wye Grounded

Figure 19:
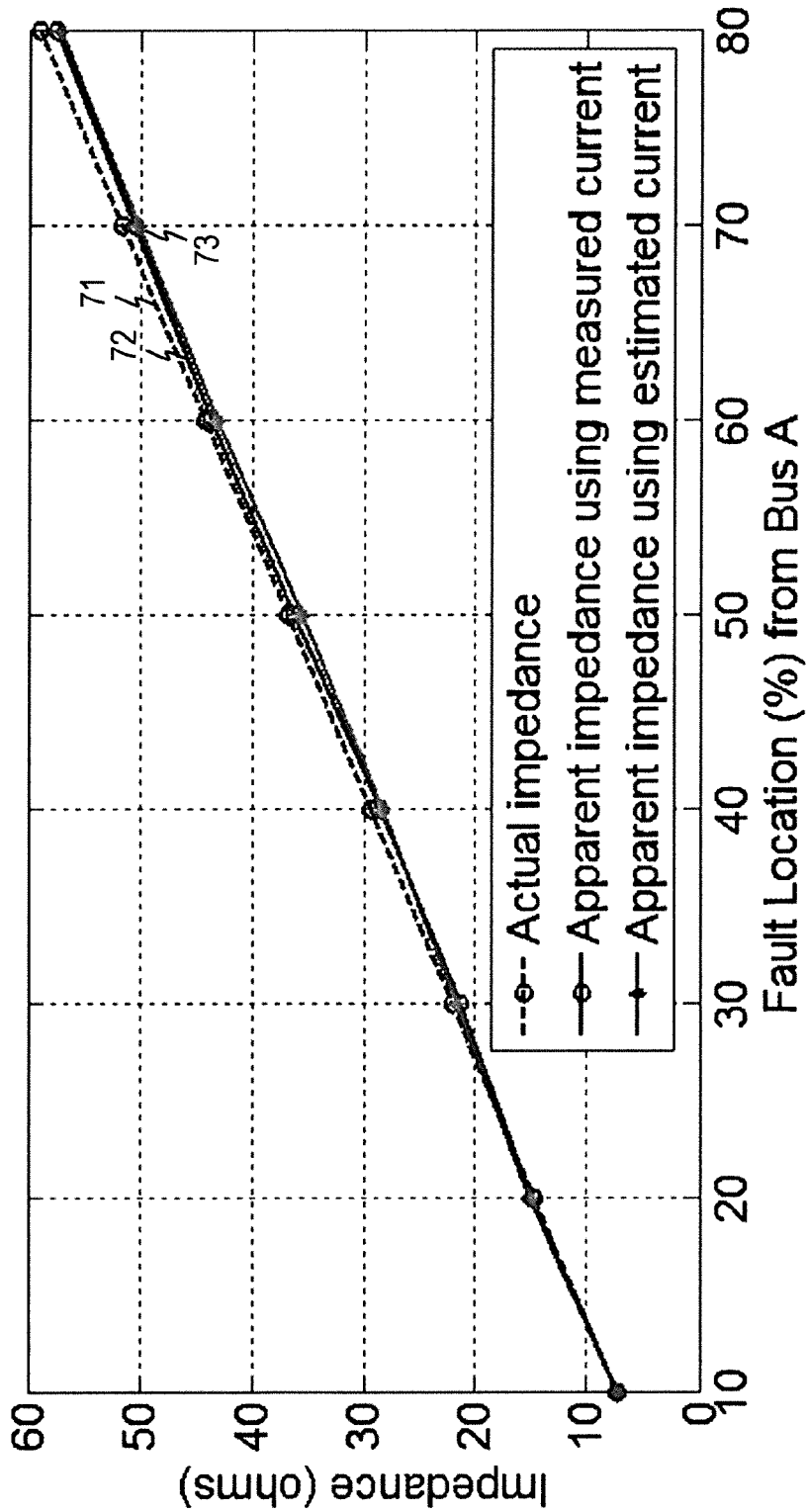
FIG. 19 is a diagram showing actual impedance, apparent impedance obtained when using a current measurement at a first line and apparent impedance obtained when estimating a zero-sequence current in the first line using the disclosed techniques, for a wye grounded—wye grounded transformer configuration and the first line being in service.

FIG. 19 shows the apparent impedance calculated for faults at different locations on the second line 12 when both lines 11, 12 are in operation and the transformer configuration is delta-wye grounded. Shown are the actual impedance 71, the apparent impedance 72 calculated using current measured from the first line, and the apparent impedance 73 calculated using the estimated first line current as in the proposed solution, as obtained by a protection device and method according to an embodiment. The apparent impedance 73 calculated using the estimated currents is very close to the apparent impedance 72 calculated using the measured current, while obviating the need for obtaining the current measurement from a line that is parallel to the line protected by the protection device that performs the mutual coupling compensation.

Robustness Against System Impedance Variations

The techniques disclosed herein turn out to be robust against variations in system impedances, such as source impedance(s) and/or transformer impedance(s). Thus, estimates are sufficient to approximate the source impedance(s) and/or transformer impedance(s) in the techniques disclosed above. The estimates may even be default values, in the absence of more specific information, or may be received as system configuration information.

Figure 20:
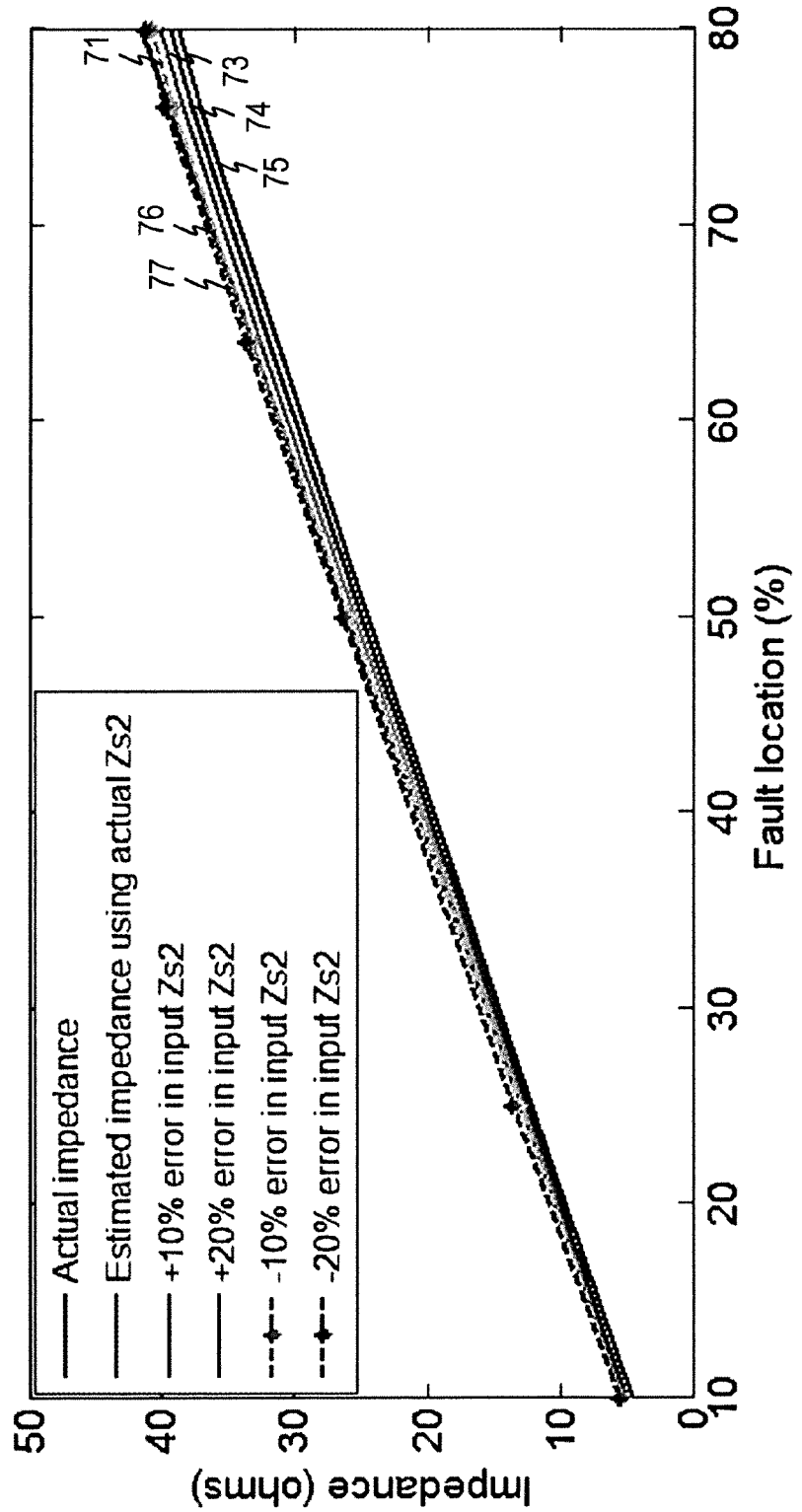
FIG. 20 is a diagram showing actual impedance and apparent impedances obtained when estimating a zero-sequence current in the first line using the disclosed techniques, for a delta-wye grounded transformer configuration and the first line being open and grounded, for the actual remote source impedance and variations of the remote source impedance around its actual value.

FIG. 20 shows the actual impedance 71 and apparent impedances 73-77 obtained when estimating a zero-sequence current in the first line using the disclosed techniques, for a wye grounded—wye grounded transformer configuration and the first line being in service. Curve 73 represents the apparent impedance obtained when using the actual remote source impedance $Z_{S2}$. Curve 74 represents the apparent impedance obtained when using a values for $Z_{S2}$ that exceeds the actual remote source impedance by 10%. Curve 75 represents the apparent impedance obtained when using a values for $Z_{S2}$ that exceeds the actual remote source impedance by 20%. Curve 76 represents the apparent impedance obtained when using a values for $Z_{S2}$ that is less than the actual remote source impedance by 10%. Curve 77 represents the apparent impedance obtained when using a values for $Z_{S2}$ that that is less than the actual remote source impedance by 20%.

As is evident from FIG. 20, the results are robust against deviations of the numerical values for the source impedance (s) from their actual values. This similarly applies when using the Equation(s) that depend on both local and remote source impedances and/or when using the Equation(s) that depend on transformer impedance(s).

Protection devices, methods, and systems according to embodiments provide a zero-sequence mutual coupling compensation for distance protection of double-circuit transmission lines. The devices, methods, and systems according to embodiments eliminate the need for obtaining current measurement from the line parallel to the line on which the protection device is provided to achieve mutual coupling compensation. Instead, the first zero-sequence current in the first line current is estimated using available digital substation data, local measurements on the line that is being protected and impedance parameters.

The devices, methods, and systems according to embodiments provide results that are both accurate and robust.

The devices, methods, and systems according to embodiments may be used to provide distance protection for transmission networks in which the lines may have a length of at least 50 km, of at least 100 km, of at least 150 km, of at least 200 km, without being limited thereto.

The devices, methods, and systems according to embodiments may be used to provide distance protection for transmission networks in an electric grid that includes renewable energy sources.

While embodiments have been described in detail in the drawings and foregoing description, such description is to be considered illustrative or exemplary and not restrictive. Variations to the disclosed embodiments can be understood and effected by those skilled in the art from a study of the drawings, the disclosure, and the appended claims. In the claims, the word "comprising" does not exclude other elements or steps, and the indefinite article "a" or "an" does not exclude a plurality. The mere fact that certain elements or steps are recited in distinct claims does not indicate that a combination of these elements or steps cannot be used to advantage, specifically, in addition to the actual claim dependency, any further meaningful claim combination shall be considered disclosed.

The invention claimed is:

1. A device for use with a double-circuit power transmission system having a first line and a second line, wherein the device is a protection device operative to perform a protection function based on the apparent impedance, and wherein the protection function is a distance protection function, the device comprising:
an interface to receive a current measurement for the second line; and
at least one processor operative to
calculate a second zero-sequence current in the second line based on the current measurement,
estimate a first zero-sequence current in the first line based on the second zero-sequence current, wherein the device is operative to multiply the second zero-sequence current by a multiplicative factor to estimate the first zero-sequence current, and wherein the multiplicative factor is dependent on a status of the first line and a transformer configuration of transformers at opposite terminals of both the first line and the second line,
determine an apparent impedance based on the estimated first zero-sequence current, and
trip a relay, circuit breaker, or switch as a function of the apparent impedance.

2. The device of claim 1, wherein the device is operative to estimate the first zero-sequence current without using a current measurement for the first line.

3. The device of claim 1, wherein the device is operative to determine an estimate for a fault location of a fault in the second line.

4. The device of claim 3, wherein the device is operative to estimate the first zero-sequence current based on the estimate for the fault location.

5. The device of claim 3 wherein the device is operative to determine estimates for the fault location, the first zero-sequence current, and the apparent impedance in an iterative procedure.

6. The device of claim 1, wherein the interface is operative to receive a zero-sequence voltage at a terminal of the second line and the device is operative to determine the first zero-sequence current based on the zero-sequence voltage.

7. The device of claim 1, wherein the multiplicative factor is dependent on
whether the first line is (i) in service or (ii) open and grounded and
whether a transformer configuration of transformers at opposite terminals of both the first line and the second line is (i) delta-wye grounded or (ii) wye grounded-wye grounded.

8. The device of claim 1, wherein the multiplicative factor is
dependent on a transformer impedance of at least one of the transformers and independent of source impedances for the delta-wye grounded transformer configuration, and
dependent on a source impedance of at least one source, electrically connected to an opposite side of one of the transformers from the device for a wye grounded-wye grounded transformer configuration.

9. The device of claim 1, wherein the device is operative to determine the apparent impedance including a mutual coupling compensation, the mutual coupling compensation being dependent on the estimated first zero-sequence current in the first line.

10. The device of claim 9, wherein the mutual coupling compensation is performed for determining the apparent impedance for distance protection of the double-circuit power transmission system.

11. The device of claim 9, wherein determining the apparent impedance including the mutual coupling compensation comprises computing a sum of a short circuit current in a faulted phase of the second line, a product of a first factor and the estimated first zero-sequence current, and a product of a second factor and the second zero-sequence current to determine the apparent impedance.

12. An electric power system, comprising:
double-circuit transmission system comprising:
a first line and
a second line; and
the device of claim 1 operatively coupled to the second line to perform a protection function for the second line.

13. A method, comprising:
estimating, by a device, a first zero-sequence current in a first line of a double-circuit transmission system, the first zero-sequence current being estimated based on multiplying a second zero-sequence current in a faulted second line of the double-circuit transmission system by a multiplicative factor to estimate the first zero-sequence current, wherein the multiplicative factor is dependent on a status of the first line and a transformer configuration of transformers at opposite terminals of both the first line and the second line;

determining, by the device, an apparent impedance based on the estimated first zero-sequence current; and tripping, by the device, a relay, circuit breaker, or switch as a function of the apparent impedance.

14. The method of claim 13, wherein determining the apparent impedance comprises determining the apparent impedance including a mutual coupling compensation, the mutual coupling compensation being dependent on the estimated first zero-sequence current in the first line.

15. The method of claim 14, wherein the mutual coupling compensation is performed for determining the apparent impedance for distance protection of the double-circuit transmission system, and wherein determining the apparent impedance including the mutual coupling compensation comprises computing a sum of a short circuit current in a faulted phase of the second line, a product of a first factor and the estimated first zero-sequence current, and a product of a second factor and the second zero-sequence current to determine the apparent impedance.

* * * * *